(12) United States Patent
Butler et al.

(10) Patent No.: US 9,494,869 B2
(45) Date of Patent: Nov. 15, 2016

(54) LITHOGRAPHIC APPARATUS AND DEVICE MANUFACTURING METHOD

(71) Applicant: ASML Netherlands B.V., Veldhoven (NL)

(72) Inventors: Hans Butler, Best (NL); Arno Jan Bleeker, Westerhoven (NL);
(Continued)

(73) Assignee: ASML NETHERLANDS B.V., Veldhoven (NL)

( * ) Notice: Subject to any disclaimer, the term of this patent is extended or adjusted under 35 U.S.C. 154(b) by 153 days.

(21) Appl. No.: 14/357,530

(22) PCT Filed: Dec. 5, 2012

(86) PCT No.: PCT/EP2012/074507
§ 371 (c)(1),
(2) Date: May 9, 2014

(87) PCT Pub. No.: WO2013/098053
PCT Pub. Date: Jul. 4, 2013

(65) Prior Publication Data
US 2014/0340666 A1    Nov. 20, 2014

Related U.S. Application Data

(60) Provisional application No. 61/580,417, filed on Dec. 27, 2011, provisional application No. 61/605,022, (Continued)

(51) Int. Cl.
*G03B 27/32* (2006.01)
*G03B 27/44* (2006.01)
(Continued)

(52) U.S. Cl.
CPC ......... *G03F 7/70258* (2013.01); *G03F 7/704* (2013.01); *G03F 7/709* (2013.01); *G03F 7/70275* (2013.01);
(Continued)

(58) Field of Classification Search
CPC ............. G03F 7/70258; G03F 7/70275; G03F 7/70366; G03F 7/70391; G03F 7/704;
(Continued)

(56) References Cited

U.S. PATENT DOCUMENTS 4,090,206 A     5/1978  Pfeifer
4,121,143 A  *  10/1978  Habermann ........ F16C 32/0453
                                                    310/90.5
(Continued)

FOREIGN PATENT DOCUMENTS

CN    101305206    11/2008
CN    101364052    2/2009
(Continued)

OTHER PUBLICATIONS

LOT-Oriel Group Europe, "MicroWriter™ Laser Lithography System," www.LOT-Oriel.com (2 pp, date unknown, obtained Jul. 2010).
(Continued)

*Primary Examiner* — Colin Kreutzer
(74) *Attorney, Agent, or Firm* — Pillsbury Winthrop Shaw Pittman LLP

(57) ABSTRACT

An exposure apparatus including a projection system configured to project a plurality of radiation beams onto a target; a movable frame that is at least rotatable around an axis; and an actuator system configured to displace the movable frame to an axis away from an axis corresponding to the geometric center of the movable frame and to cause the frame to rotate around an axis through the center of mass of the frame.

20 Claims, 22 Drawing Sheets

(72) Inventors: Pieter Renaat Maria Hennus, Peer (BE); Martinus Hendricus Henricus Hoeks, Breugel (NL); Sven Antoin Johan Hol, Eindhoven (NL); Harmen Klaas Van Der Schoot, Vught (NL); Bernardus Antonius Slaghekke, Veldhoven (NL); Patricius Aloysius Jacobus Tinnemans, Hapert (NL); Marc Wilhelmus Maria Van Der Wijst, Veldhoven (NL); Koen Jacobus Johannes Maria Zaal, Eindhoven (NL); Theodorus Petrus Maria Cadee, Vlierden (NL); Ruud Antonius Catharina Maria Beerens, Roggel (NL); Olof Martinus Josephus Fischer, Veldhoven (NL); Wilhelmus Henricus Theodorus Maria Aangenent, 's-Hertogenbosch (NL); Niels Johannes Maria Bosch, Venlo (NL)

Related U.S. Application Data filed on Feb. 29, 2012, provisional application No. 61/642,939, filed on May 4, 2012.

(51) Int. Cl.
 *G03B 27/54* (2006.01)
 *H02K 5/24* (2006.01)
 *G03F 7/20* (2006.01)

(52) U.S. Cl.
 CPC ....... *G03F 7/70366* (2013.01); *G03F 7/70558* (2013.01); *G03F 7/70816* (2013.01); *G03F 7/70391* (2013.01)

(58) Field of Classification Search
 CPC .............. G03F 7/70558; G03F 7/70816; G03F 7/0825; G03F 7/70833; G03F 7/709
 USPC .................................. 310/51; 355/46, 67, 77
 See application file for complete search history.

(56) References Cited

U.S. PATENT DOCUMENTS

| | | | |
|---|---|---|---|
| 4,447,126 A | 5/1984 | Heidrich | |
| 4,520,472 A | 5/1985 | Reno | |
| 4,525,729 A | 6/1985 | Agulnek | |
| 4,640,573 A | 2/1987 | Kataoka | |
| 4,780,730 A | 10/1988 | Dodge | |
| 4,796,038 A | 1/1989 | Allen | |
| 4,844,568 A | 7/1989 | Suzuki | |
| 4,864,216 A | 9/1989 | Kalata | |
| 4,952,949 A | 8/1990 | Uebbing | |
| 5,051,762 A | 9/1991 | Lea | |
| 5,216,247 A | 6/1993 | Wang | |
| 5,216,534 A | 6/1993 | Boardman | |
| 5,229,872 A | 7/1993 | Mumola | |
| 5,296,891 A | 3/1994 | Vogt | |
| 5,457,488 A | 10/1995 | Nakamura | |
| 5,481,392 A | 1/1996 | Damer | |
| 5,523,193 A | 6/1996 | Nelson | |
| 5,568,320 A | 10/1996 | Rees | |
| 5,589,973 A | 12/1996 | King | |
| 5,610,754 A | 3/1997 | Gheen | |
| 5,668,587 A | 9/1997 | Hammond | |
| 5,705,788 A | 1/1998 | Beyer | |
| 5,838,024 A | 11/1998 | Masuda | |
| 5,840,451 A | 11/1998 | Moore | |
| 6,037,965 A | 3/2000 | Gross | |
| 6,133,986 A | 10/2000 | Johnson | |
| 6,204,875 B1 | 3/2001 | De Loor | |
| 6,268,613 B1 | 7/2001 | Cantu | |
| 6,310,710 B1 | 10/2001 | Shahar | |
| 6,313,862 B1 | 11/2001 | Berner | |
| 6,449,030 B1 | 9/2002 | Kwan | |
| 6,466,352 B1 | 10/2002 | Shahar | |
| 6,490,025 B1 * | 12/2002 | Makinouchi | G03F 7/70358 248/638 |
| 6,525,803 B2 | 2/2003 | Kwan et al. | |
| 6,531,681 B1 | 3/2003 | Markle | |
| 6,559,438 B1 | 5/2003 | Drobot | |
| 6,683,727 B1 | 1/2004 | Goring | |
| 6,765,647 B1 | 7/2004 | Nishi | |
| 6,795,169 B2 | 9/2004 | Tanaka | |
| 6,967,711 B2 | 11/2005 | Gui | |
| 7,116,402 B2 | 10/2006 | Gui | |
| 7,459,247 B2 | 12/2008 | Bijnen et al. | |
| 7,626,181 B2 | 12/2009 | Visser | |
| 7,969,636 B2 | 6/2011 | Naito | |
| 8,059,259 B2 | 11/2011 | Butler et al. | |
| 8,531,648 B2 | 9/2013 | De Jager et al. | |
| 8,994,919 B2 | 3/2015 | Butler et al. | |
| 2002/0115021 A1 | 8/2002 | Piao | |
| 2002/0126479 A1 | 9/2002 | Zhai | |
| 2002/0171047 A1 | 11/2002 | Chan | |
| 2003/0043582 A1 | 3/2003 | Chan | |
| 2003/0091277 A1 | 5/2003 | Mei | |
| 2004/0124372 A1 | 7/2004 | Gil | |
| 2004/0135159 A1 | 7/2004 | Siegel | |
| 2004/0257629 A1 | 12/2004 | Noehte | |
| 2005/0167508 A1 | 8/2005 | Syms | |
| 2006/0001855 A1 | 1/2006 | Lof | |
| 2006/0058972 A1 * | 3/2006 | Kok | G03F 7/70666 702/56 |
| 2006/0103719 A1 | 5/2006 | Katzir | |
| 2006/0108508 A1 | 5/2006 | Khalid | |
| 2006/0141373 A1 | 6/2006 | Bijnen et al. | |
| 2007/0034890 A1 | 2/2007 | Daschner | |
| 2007/0150778 A1 | 6/2007 | Visser | |
| 2007/0182808 A1 | 8/2007 | Stiblert | |
| 2007/0296936 A1 | 12/2007 | Kato | |
| 2008/0042969 A1 | 2/2008 | Baker | |
| 2008/0047445 A1 | 2/2008 | Berner | |
| 2008/0137051 A1 | 6/2008 | Maly | |
| 2008/0160211 A1 | 7/2008 | Siegel | |
| 2008/0210888 A1 | 9/2008 | Inoue | |
| 2009/0103066 A1 | 4/2009 | Butler et al. | |
| 2009/0201477 A1 | 8/2009 | Butler | |
| 2009/0207393 A1 | 8/2009 | Butler et al. | |
| 2009/0296063 A1 | 12/2009 | Opower | |
| 2010/0089712 A1 | 4/2010 | Butler et al. | |
| 2010/0142757 A1 | 6/2010 | Sandstrom | |
| 2010/0265557 A1 | 10/2010 | Sallander | |
| 2011/0051211 A1 | 3/2011 | Walther | |
| 2011/0188016 A1 | 8/2011 | De Jager | |
| 2012/0019794 A1 | 1/2012 | Hol et al. | |
| 2014/0071421 A1 | 3/2014 | De Jager et al. | |

FOREIGN PATENT DOCUMENTS

| | | |
|---|---|---|
| CN | 101441420 | 5/2009 |
| CN | 102203674 | 9/2011 |
| DE | 42 27 014 | 2/1994 |
| DE | 4315580 | 11/1994 |
| DE | 4315581 | 11/1994 |
| DE | 19813127 | 10/1998 |
| EP | 1 835 347 | 9/2007 |
| JP | 57-152273 | 9/1982 |
| JP | 05-121294 | 5/1993 |
| JP | 06-275936 | 9/1994 |
| JP | 2002-184666 | 6/2002 |
| JP | 2003-220484 | 8/2003 |
| JP | 2004-343101 | 12/2004 |
| JP | 2006-186370 | 7/2006 |
| JP | 2007-41239 | 2/2007 |
| JP | 2007-165885 | 6/2007 |
| JP | 2009-514011 | 4/2009 |
| JP | 2012-503325 | 2/2012 |
| JP | 2012-511169 | 5/2012 |
| JP | 2013-520816 | 6/2013 |

(56) References Cited

FOREIGN PATENT DOCUMENTS

| | | |
|---|---|---|
| KR | 2009-0087834 | 8/2009 |
| KR | 2011-0073544 | 6/2011 |
| TW | I264617 | 10/2006 |
| TW | 201015244 | 4/2010 |
| TW | 201044012 | 12/2010 |
| WO | 97/34171 | 9/1997 |
| WO | 98/33096 | 7/1998 |
| WO | 98/38597 | 9/1998 |
| WO | 2005/006082 | 1/2005 |
| WO | 2005/067012 | 7/2005 |
| WO | 2006/002668 | 1/2006 |
| WO | 2006/046507 | 5/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |
| WO | 2011/104175 | 9/2011 |

OTHER PUBLICATIONS

"Large-Plate Exposure System FX-63S," Nikon Web Magazine: Nikon Technology Outlook, Sep. 24, 2004, pp. 1-4.
JetScreen DX Flat Brochure (6 pp., date unknown, obtained Feb. 2009).
"Lithographic Apparatus and Device Manufacturing Method," Research Disclosure, Mason Publications, Hampshire, GB, vol. 551, No. 29. Mar. 1, 2010, p. 322, XP007139689, ISSN: 0374-4353.
International Search Report and Written Opinion mailed Apr. 5, 2013 in corresponding International Patent Application No. PCT/EP2012/074507.
International Preliminary Report on Patentability and Written Opinion mailed Jul. 10, 2014 in International Patent Application No. PCT/EP2012/074507.
Taiwan Office Action dated Mar. 11, 2015 in corresponding Taiwan Patent Application No. 101147225.
Japanese Office Action dated Mar. 17, 2015 in corresponding Japanese Patent Application No. 2014-543941.
Chinese Office Action dated Jun. 30, 2015 in corresponding Chinese Patent Application No. 201280065095.4.
Korean Office Action mailed Nov. 26, 2015 in corresponding Korean Patent Application No. 10-2014-7018844.

\* cited by examiner

US 9,494,869 B2

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2012/074504, filed Dec. 5, 2012, which claims the benefit of priority of U.S. provisional application No. 61/580,417, which was filed on Dec. 27, 2011, U.S. provisional application No. 61/605,022, which was filed on Feb. 29, 2012 and U.S. provisional application No. 61/642,939, which was filed on May 4, 2012 and which are incorporated herein in their entirety by reference.

FIELD

The present invention relates to a lithographic or exposure apparatus and a method for manufacturing a device.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may be transferred on (part of) the substrate (e.g. silicon wafer or a glass plate), e.g. via imaging onto a layer of radiation-sensitive material (resist) provided on the substrate. In a similar regard, an exposure apparatus is a machine that uses a radiation beam in forming a desired pattern on or in a substrate (or a part thereof).

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices and the like. A programmable patterning device could also be formed from an electro-optical deflector, configured for example to move spots of radiation projected onto the substrate or to intermittently direct a radiation beam away from the substrate, for example to a radiation beam absorber. In either such arrangement, the radiation beam may be continuous.

SUMMARY

In an exposure apparatus, movement of certain components with high speed/acceleration yet with high accuracy is a significant factor in improving throughput and pattern exposure accuracy. Generally, the two demands of improved throughput and pattern exposure accuracy, can contradict each other; higher accelerations/speed can cause higher internal dynamic vibrations (or deformations), which can result in a deterioration of the pattern exposure accuracy.

It is therefore desirable, for example, to provide a system that can provide higher speed/acceleration of a movable component yet retain pattern exposure accuracy.

According to an embodiment of the invention, there is provided an exposure apparatus, comprising:
a projection system configured to project a plurality of radiation beams onto a target;
a movable frame that is at least rotatable around an axis; and
an actuator system configured to displace the movable frame to an axis away from an axis corresponding to the geometric center of the movable frame and to cause the frame to rotate around an axis through the center of mass of the frame.

According to an embodiment of the invention, there is provided an exposure apparatus, comprising:
a projection system configured to project a plurality of radiation beams onto a target;
a movable frame that is at least rotatable around an axis;
an actuator system to cause the frame to rotate; and
a controller of the actuator system configured to feedforward a gyroscopic compensation.

According to an embodiment of the invention, there is provided an exposure apparatus, comprising:
a projection system configured to project a plurality of radiation beams onto a target;
a movable frame that is at least rotatable around an axis; and
an actuator system to cause the frame to rotate relative to a part that is substantially stationary relative to the frame and having an actuator to cause the frame to displace relative to the part; and
a reaction mass movably attached to the part, the reaction mass having a portion of the actuator.

According to an embodiment of the invention, there is provided an exposure apparatus, comprising:
a projection system configured to project a plurality of radiation beams onto a target;
a movable frame that is at least rotatable around an axis; and
an actuator system to cause the frame to rotate, the actuator system comprising at least two motors around the axis;
a plurality of sensors, each of the plurality of sensors located at an angular position that substantially bisects the angular positions of two adjacent motors.

According to an embodiment of the invention, there is provided an exposure apparatus, comprising:
a projection system configured to project a plurality of radiation beams onto a target;
a movable frame that is at least rotatable around an axis; and
an actuator system to cause the frame to rotate, the actuator system comprising a first set of at least two motors about the axis and a second set of at least two motors about the axis and below the first set, wherein the second set is rotated about the axis with respect to the first set.

According to an embodiment of the invention, there is provided an exposure apparatus, comprising:
a projection system configured to project a plurality of radiation beams onto a target;
a movable frame that is at least rotatable around an axis;

an actuator system to cause the frame to rotate; and a sensor system to measure the frame in a substantially tangential direction.

According to an embodiment of the invention, there is provided an exposure apparatus, comprising:

a projection system configured to project a plurality of radiation beams onto a target;

a movable frame that is at least rotatable around an axis;

an actuator system to cause the movable frame to rotate; and a controller to adjust a position of the movable frame to compensate at least in part for imbalance of the movable frame or imbalance of another movable frame.

According to an embodiment of the invention, there is provided an exposure apparatus, comprising:

a projection system configured to project a plurality of radiation beams onto a target;

a movable frame that is at least rotatable around an axis;

an actuator system to cause the frame to rotate; and a controller to adjust a characteristic of at least one of the radiation beams to compensate at least in part for an imbalance of or applied to the frame.

According to an embodiment of the invention, there is provided a device manufacturing method, comprising:

projecting a plurality of radiation beams onto a target;

rotating a movable frame, comprising a lens, around an axis; and displacing the movable frame to an axis away from an axis corresponding to the geometric center of the movable frame and causing the frame to rotate around an axis through the center of mass of the frame.

According to an embodiment of the invention, there is provided a device manufacturing method, comprising:

projecting a plurality of radiation beams onto a target;

rotating a movable frame, comprising a lens, around an axis; and controlling a tilt of the movable frame using a control loop having a feedforward of a gyroscopic compensation.

According to an embodiment of the invention, there is provided a device manufacturing method, comprising:

projecting a plurality of radiation beams onto a target;

rotating a movable frame, comprising a lens, around an axis and relative to a part that is substantially stationary relative to the frame; and absorbing an actuator reaction force in a reaction mass movably attached to the part, the reaction mass having a portion of the actuator used to position the frame.

According to an embodiment of the invention, there is provided a device manufacturing method, comprising:

projecting a plurality of radiation beams onto a target;

rotating a movable frame, comprising a lens, around an axis using an actuator system, the actuator system comprising at least two motors around the axis; and measuring the frame using a plurality of sensors, each of the plurality of sensors located at an angular position that substantially bisects the angular positions of two adjacent motors.

According to an embodiment of the invention, there is provided a device manufacturing method, comprising:

projecting a plurality of radiation beams onto a target; and rotating a movable frame, comprising a lens, around an axis using an actuator system, the actuator system comprising a first set of at least two motors about the axis and a second set of at least two motors about the axis and below the first set, wherein the second set is rotated about the axis with respect to the first set.

According to an embodiment of the invention, there is provided a device manufacturing method, comprising:

projecting a plurality of radiation beams onto a target;

rotating a movable frame, comprising a lens, around an axis using an actuator system; and measuring the frame in a substantially tangential direction using a sensor system.

According to an embodiment of the invention, there is provided a device manufacturing method comprising:

projecting a plurality of radiation beams onto a target;

rotating a movable frame around an axis using an actuator system; and adjusting a position of the frame to compensate at least in part for imbalance of the frame or imbalance of another movable frame.

According to an embodiment of the invention, there is provided a device manufacturing method comprising:

projecting a plurality of radiation beams onto a target;

rotating a movable frame around an axis using an actuator system; and adjusting a characteristic of at least one of the radiation beams to compensate at least in part for an imbalance of or applied to the frame.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication no. US 2011-0188016, U.S. patent application No. U.S. 61/473,636 and U.S. patent application No. 61/524,190 which are hereby incorporated by reference in their entireties. An embodiment of the present invention, however, may be used with any form of programmable patterning device including, for example, those discussed above.

Figure 1:
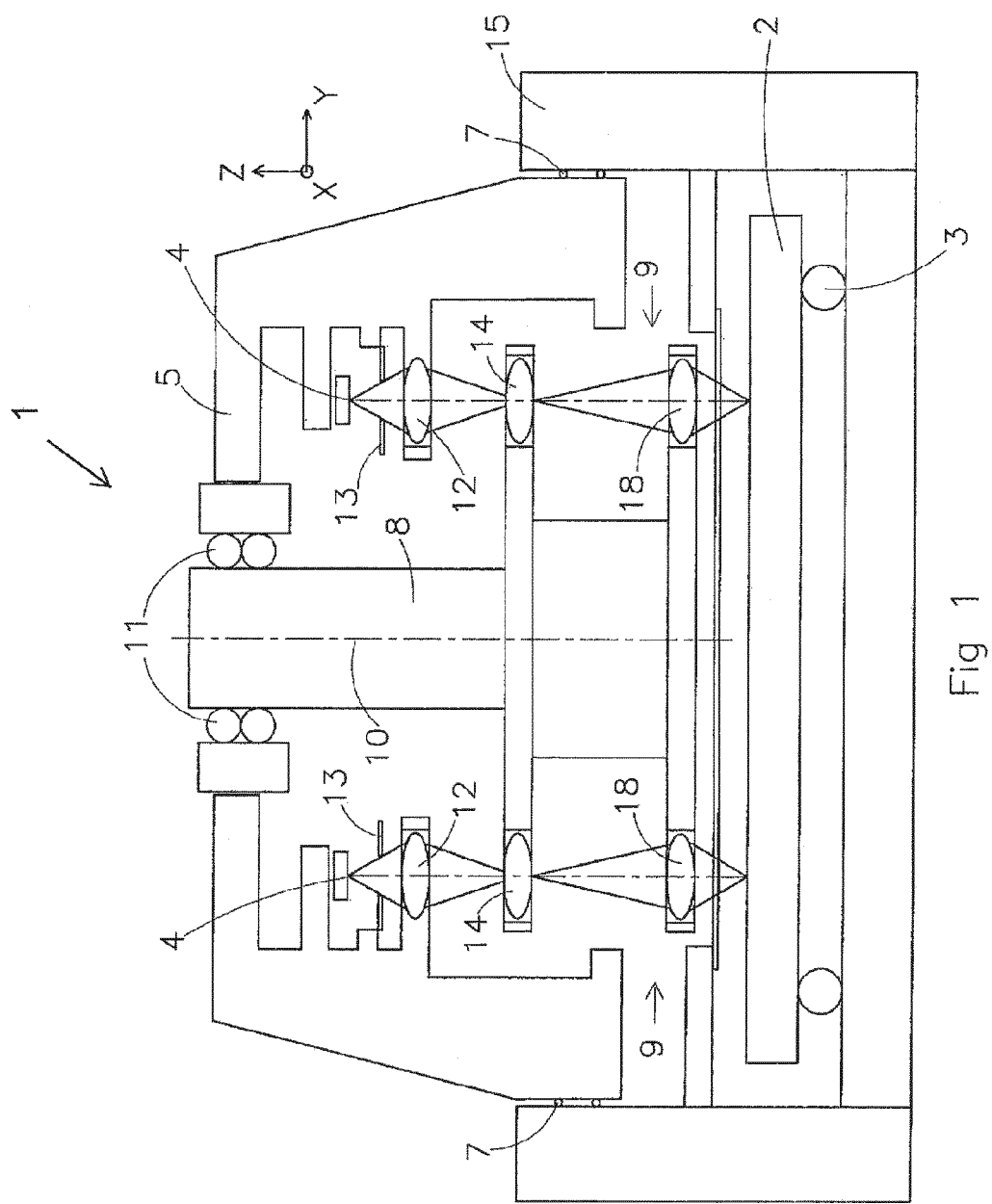
FIG. 1 depicts a part of a lithographic or exposure apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
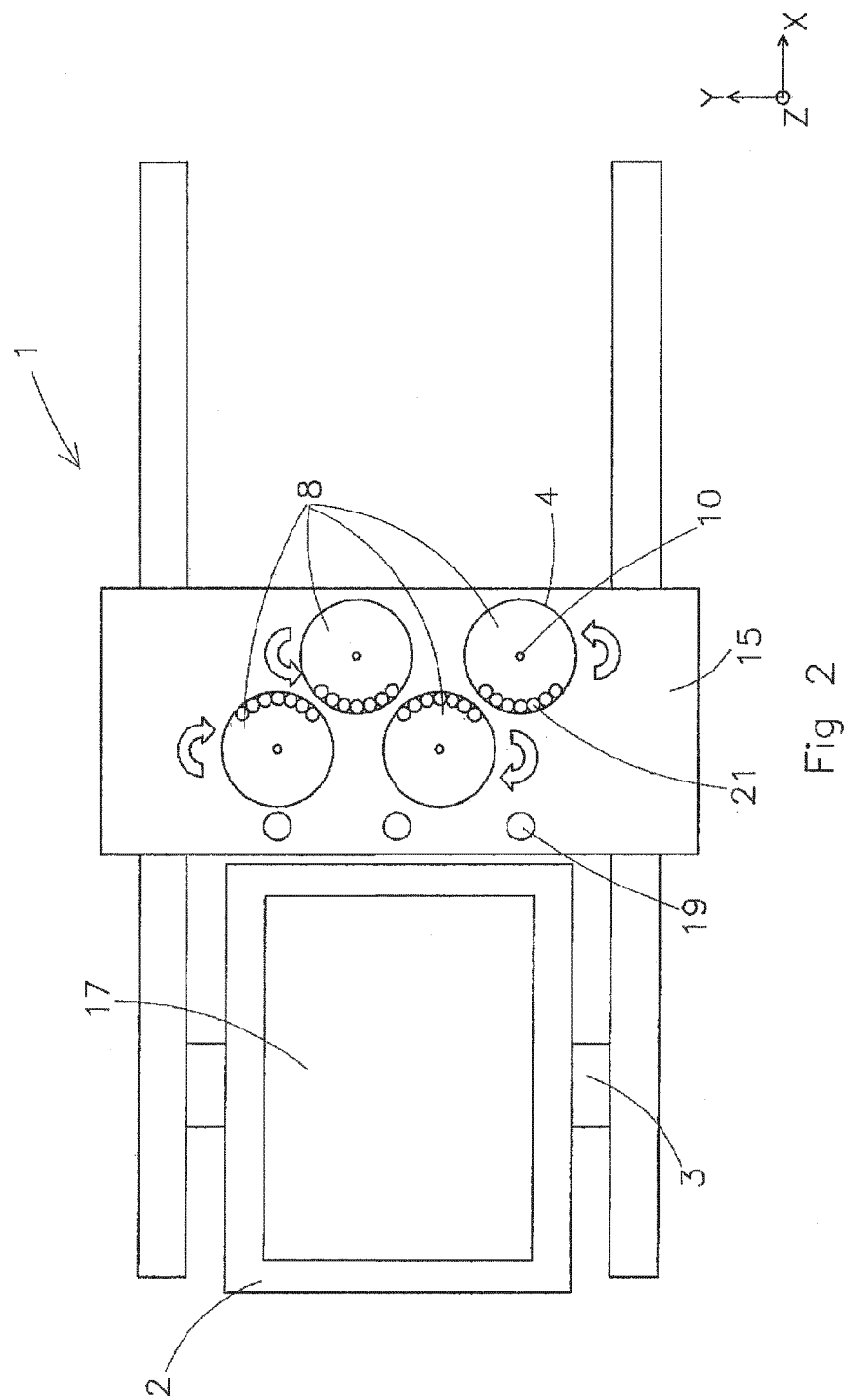
FIG. 2 depicts a top view of a part of the lithographic or exposure apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The apparatus 1 may comprise an actuator (e.g. motor) 11 to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator (e.g. motor) 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the beam on the substrate is scanned over a portion of the substrate. By simultaneously moving the substrate on the substrate table 2 underneath the optical column, the portion of the substrate which is subjected to the beam of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be provided in the resist layer on the substrate.

FIG. 2 depicts a schematic top view of the lithographic or exposure apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to project the beam of each of the self-emissive contrast devices 4. The apparatus may be provided with an actuator to rotate the optical column comprising the frame 8 and the lenses 14, 18 with respect to the substrate.

Figure 3:
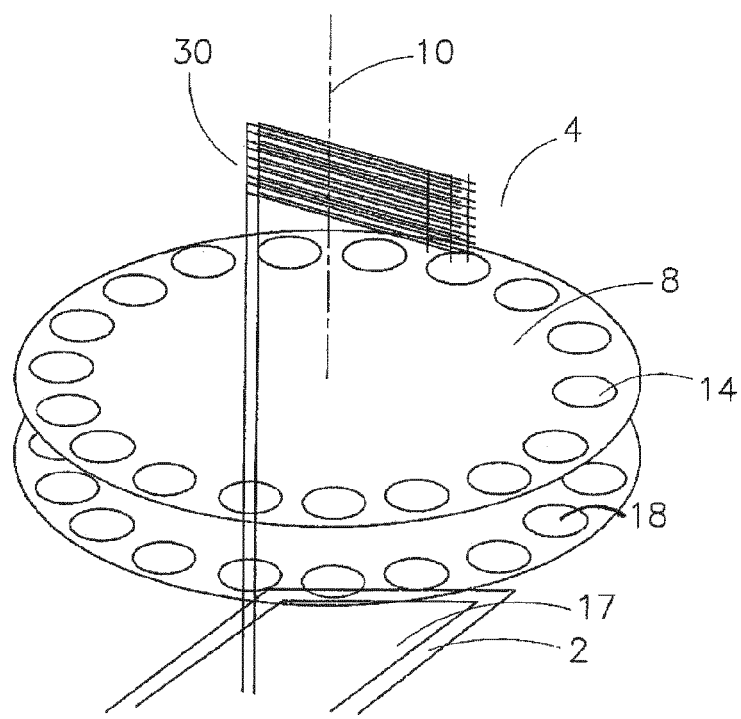
FIG. 3 depicts a highly schematic, perspective view of a part of a lithographic or exposure apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
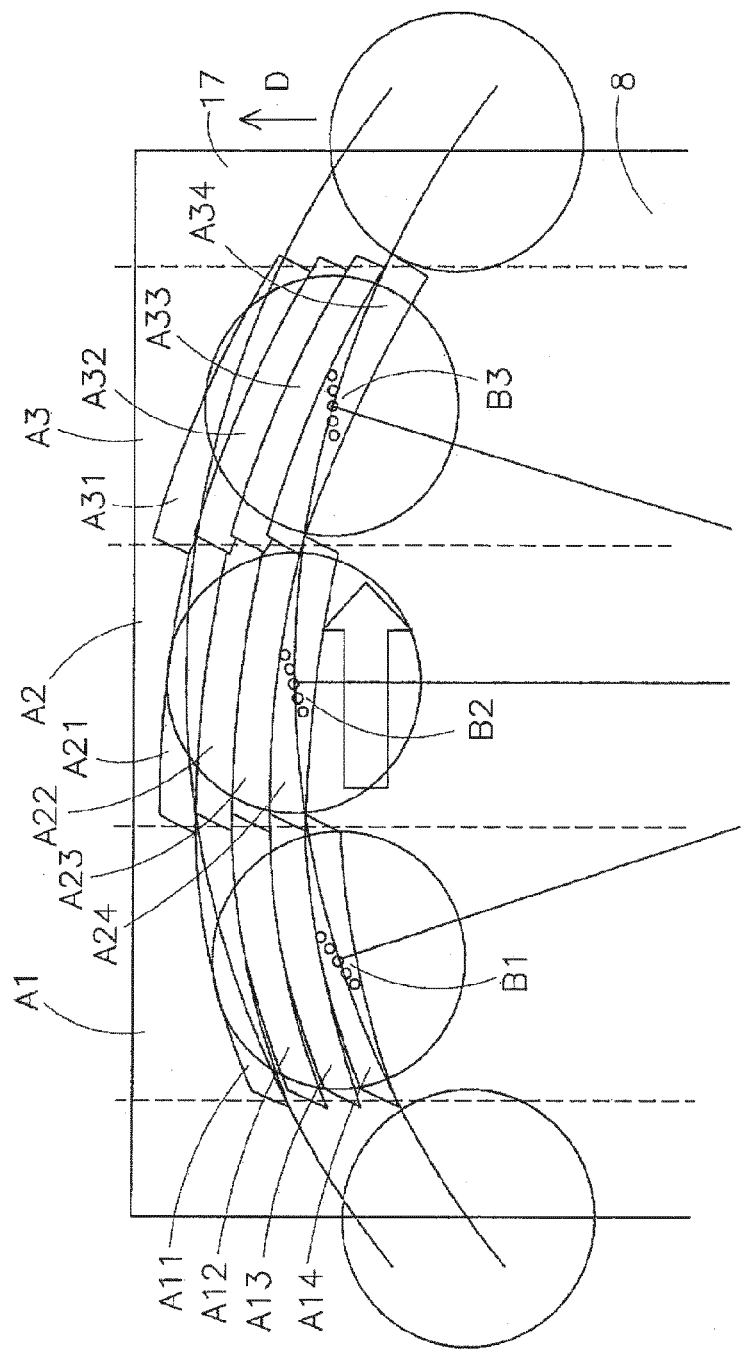
FIG. 4 depicts a schematic top view of projections by the lithographic or exposure apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A2, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, areas A21, A22, A23 and A24 (areas A21, A22, A23 being previously scanned and A24 being currently scanned as shown in FIG. 4) for beams B2 and areas A31, A32, A33 and A34 (areas A31, A32, A33 being previously scanned and A34 being currently scanned as shown in FIG. 4) for beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of a beam projected onto a substrate. The arrangement may be provided to adjust the focus of the beam projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer. The substrate onto which the beam of radiation is projected may be referred to as a target.

Figure 5:
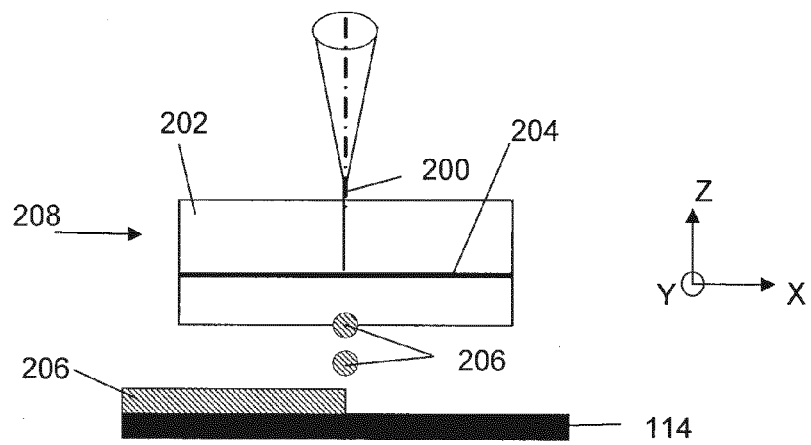
FIG. 5 depicts, in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

An exposure apparatus may have a number of moving objects. The discussion that follows focuses on ways to, for example, increase the acceleration of one or more such objects, increase the speed of such object(s), reduce vibration of such object(s), improve the control of such object(s), etc. An example movable object in an exposure apparatus is the frame 8 as discussed above. Frame 8, having, for example, field lens 14 and/or imaging lens 18, may be rotated in the exposure apparatus and may be rotated at a high speed. Actuator 11 is used to drive the movement of frame 8. The discussion herein will focus on a rotatable frame 8 (which may additionally move in a linear fashion), but the concepts, principles and embodiments described herein may be applied, as appropriate, to a linearly moving object (e.g., a linearly moving frame 8). Further, while the discussion herein will focus on frame 8, the concepts, principles and embodiments described herein may be applied, as appropriate, to one or more additional or different moving objects in, for example, an exposure apparatus.

Figure 6:
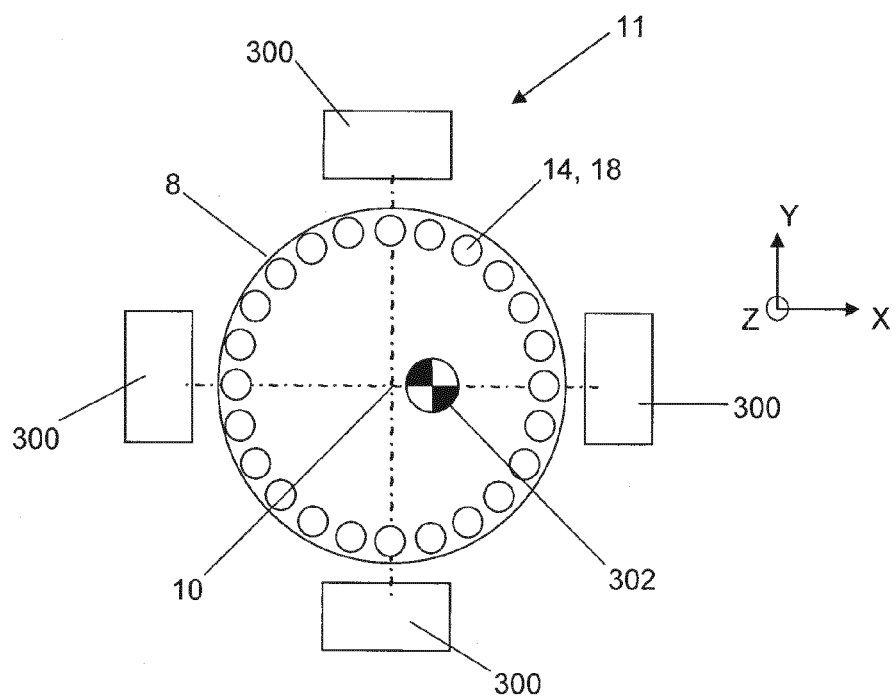
FIG. 6 depicts a schematic top view of a movable frame in a lithographic or exposure apparatus according to an embodiment of the invention.

Referring to FIG. 6, a highly schematic top view of an embodiment of frame 8 is depicted along with actuator 11. The actuator 11 comprises a plurality of motors 300, each having a part thereof spaced around a part of the frame 8 and mounted on a stationary part, which is substantially stationary relative to the frame 8 (although in an embodiment, the stationary part may be moved with respect to the frame 8 in certain circumstances). In an embodiment, the stationary part may be the supporting frame 5, 15 (on which optionally one or more measurement marks or sensors may be mounted). In an embodiment, there are at least four motors 300 evenly spaced around the part of the frame 8. Each motor 300 may comprise a coil and magnet. In an embodiment, the magnet of the motor 300 is mounted on the frame 8 and a coil of the motor 300 is mounted on the stationary part. In an embodiment, the coil of the motor 300 is mounted on the frame 8 and the magnet of the motor 300 is mounted on the stationary part. Further, while the parts of the motors 300 are shown as external to the frame 8, they need not be if the stationary part is internal to the frame 8. See, e.g., FIG. 13 described an embodiment wherein the stationary part is internal to the frame 8.

In an embodiment, one or more of the motors 300 may be a reluctance motor. The reluctance motor may be as described in U.S. patent application Ser. No. 13/156,924, filed Jul. 9, 2011, which is incorporated herein its entirety by reference. When implemented in a rotor-stator arrangement (e.g., movable frame 8 and its stationary part), the reluctance motor may exert its force with respect to the stator. Position measurement of the rotor with respect to stator enables calculation of the current that leads to the correct force F applied to the rotor, by the equation $$F = k \frac{i^2}{g^2}$$

where i is the current in the reluctance motor, g is the gap between the stator and rotor parts of the reluctance motor, and k is a constant defined by the reluctance motor design.

The motors 300 may cause the frame 8 to move in the X-direction and/or Y-direction and optionally rotate about the X and/or Y directions. Further, in an embodiment, one or more of the motors 300 may cause the frame 8 to rotate about geometric center axis 10 and/or move the frame 8 in the Z axis. Additionally or alternatively, one or more motors 301 may be provided to cause the frame 8 to rotate about geometric center axis 10 and/or move the frame 8 in the Z axis. Further, a center of mass 302 of frame 8 is shown and the motors 300, 301 may cause the frame 8 to rotate about an axis through the center of mass 302 as discussed hereafter.

Further, in an embodiment, one or more of the motors 300 may comprise a bearing associated therewith. In an embodiment, the bearing comprises an active magnetic bearing (AMB). In an embodiment, the bearing comprises a gas bearing (e.g., air bearing). In an embodiment, the bearing is at the substantially same location as the motor 300. In an embodiment, the bearing may alternatively be at a different location or there may be one or more additional bearings to the one or more bearings at the motor 300. The bearing may provide that the movable frame 8 is stiff in 5 degrees of freedom and relatively free in another degree of freedom, e.g., rotation around the Z-axis.

Figure 7:
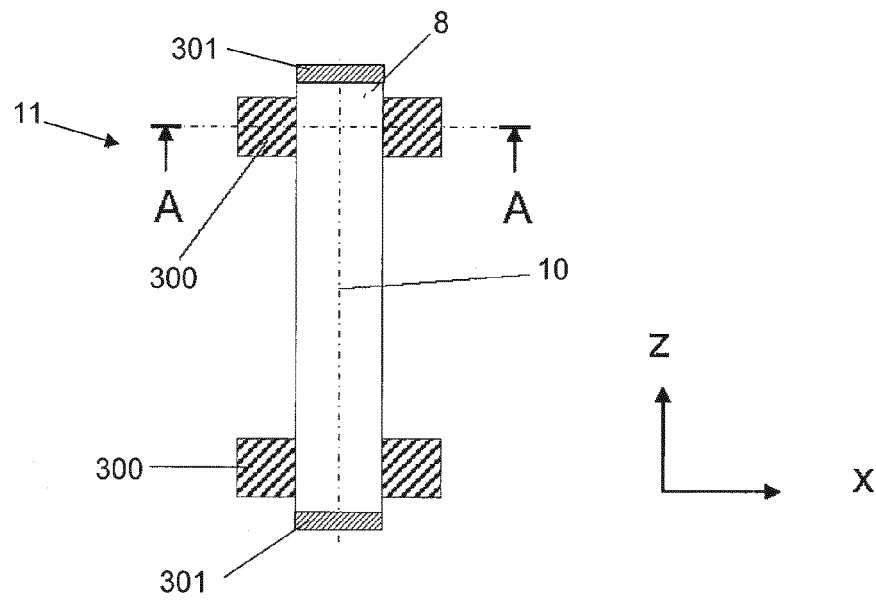
FIG. 7 depicts a schematic side view of a movable frame in a lithographic or exposure apparatus according to an embodiment of the invention.

Referring to FIG. 7, a highly schematic side view of frame 8 is depicted along with actuator 11. In this view it can be seen that the motors 300 may comprise an upper set of motors 300 and a lower set of motors 300 (e.g., they may be located at or near the ends of the frame 8). Thus, besides motors 300 being able to control the frame 8 to move in the X- and/or Y-directions, the motors 300 may additionally cause movement of the frame 8 in Rx and/or Ry directions. In an embodiment, motors 300 and/or motor 301 may cause movement of the frame 8 in the Z-direction. In an embodiment, as discussed above, the frame 8 may be supported by one or more active magnet bearings located at one or more of the motor 300 locations. The active magnet bearing allows the frame 8 to freely rotate around the Z-direction and actively controls the position of the frame 8 in the X- and Y-directions. In FIG. 7, upper and lower active magnetic bearings (located at the upper and lower sets of motors 300 respectively) may be provided, which allows control of the frame 8 in the Rx and/or Ry directions (in addition to the X- and Y-directions). A bearing for the Z- and Rz-direction is not shown, but the frame 8 may be supported, for example, in the Z-direction by any suitable passive or active bearing located, for example, at one or more of the motor 301 locations.

Figure 8:
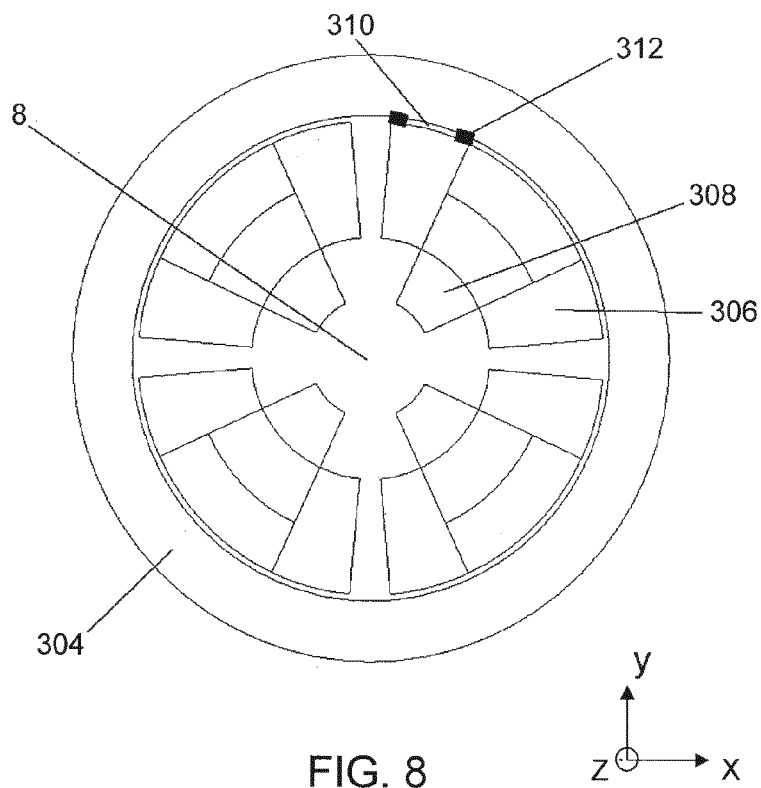
FIG. 8 depicts a schematic top view of a movable frame in a lithographic or exposure apparatus according to an embodiment of the invention.

FIG. 8 shows a cross-sectional view, as indicated by the arrows 'A' in FIG. 7 showing the active magnetic bearing working on the principle of electromagnetic suspension between the frame 8 and the stationary part 304, the frame 8 and the stationary part 304 having a respective part of the motor 300. The active magnetic bearing comprises an electromagnet assembly 306, 308, a set of power amplifiers (not shown) to supply current to the electromagnets 306 and a controller (not shown) to control the position of the frame 8 within a gap 310 between a part of the frame 8 and the stationary part 304. In the example as shown in FIG. 8, four pairs of active magnetic bearings are shown, but another number of active magnetic bearings such as 1, 2, 3 or more than 4 are possible. In an embodiment, a sensor 312 may be provided to measure a relative position of the frame 8 to the stationary part 304 and/or determine the force applied to the frame 8. The sensor is connected to associated electronics to provide feedback to the controller to enable control of the force applied to and/or position of the frame. In an embodiment, the sensor may comprise a measurement coil 312 to measure magnetic flux and thus force. The measurement coil may be as described in U.S. patent application Ser. No. 13/156,924, filed Jul. 9, 2011, which is incorporated herein its entirety by reference. The measurement coil 312 can generate a signal that is, e.g., a voltage induced in the measurement coil 312 due the magnetic flux that is generated in the magnetic circuit of the active magnetic bearing. A measurement signal representative of the magnetic flux through the magnetic circuit enables an accurate prediction of the generated force. An integrator (not shown) can obtain a signal representative of the magnetic flux through the magnetic circuit from the measurement signal (e.g., the induced voltage). A control signal to control the amplitude of current provided to the electromagnet assembly 306, 308 can thus be derived from measurement coil 312 signal.

In an embodiment, the power amplifiers supply substantially equal bias current to the electromagnets of the active magnet bearing arranged around the part of the frame 8. The position of the frame 8 is controlled by the controller which can offset the bias current as the frame 8 deviates from its center position. An active magnetic bearing has an advantage over a conventional bearing in that, for example, it does not suffer from wear as much, has low friction, and can often accommodate irregularity in mass distribution automatically, allowing the rotor to spin around an axis through its center of mass with low vibration.

In a high accuracy and/or high speed application, a high stiffness (e.g., provided by a gas bearing or by a high bandwidth of the controller of an active magnetic bearing) is used to provide sufficient tracking of the moving object and/or of the frame that supports it. For example, the position of and/or vibrations in the movable frame 8 and/or the supporting frame 5, 15 should be well controlled in order that the beams can be accurately projected on the applicable target.

A high-stiffness bearing may introduce forces in the movable frame 8 and/or the supporting frame 5, 15 due to, e.g., an unbalance in the movable frame 8. Even with a very balanced movable frame 8, a force of, for example, 1 N at a rotation frequency of 140 Hz may occur, which may result in, for example, a more than 150 nm positioning error of the frame 8. In an embodiment, only 10 nm positioning error may be allowed to enable sufficiently accurate projection of the beams.

Thus, in an embodiment, referring to FIG. 6, the frame 8 is rotated around an axis through its center of mass 302, instead of around the geometric center 10 of the frame 8 as might be done conventionally. To do so, a "zero force" is applied by the active magnetic bearing, which results in rotation of the frame 8 around an axis through its center of mass 302 (instead of around the geometric center 10). That is, the controller C for the active magnetic bearing should not produce a counteracting force for the respective active magnetic bearing actuator P that acts on the measured position and/or force, if this measured position/force deviation is caused by the unbalance of the frame 8. Effectively, there would be no "stiff" bearings such that the movable frame 8 can move in one or more other directions besides the desired rotation so that the movable frame 8 can arrive at a position in respect of the actuator 11 so that it can rotate around an axis through the center of mass 302.

Figure 9:
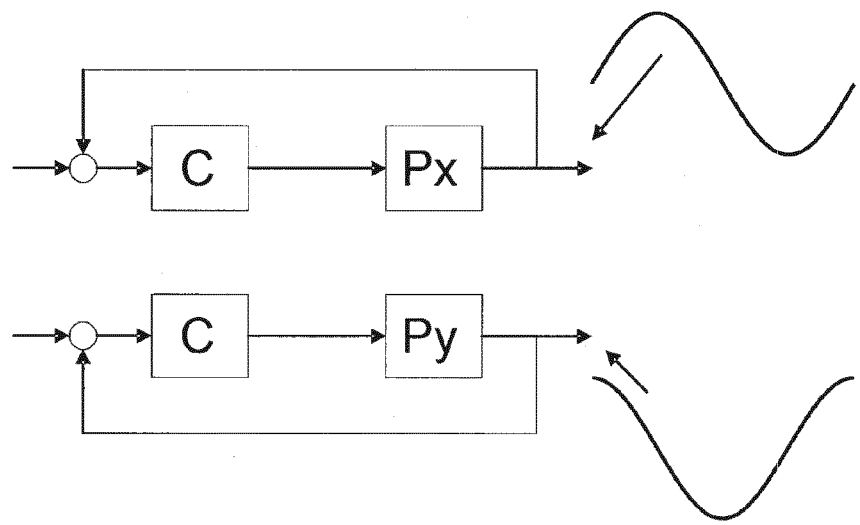
FIG. 9 depicts a control loop of a movable frame in a lithographic or exposure apparatus according to an embodiment of the invention.
Figure 10:
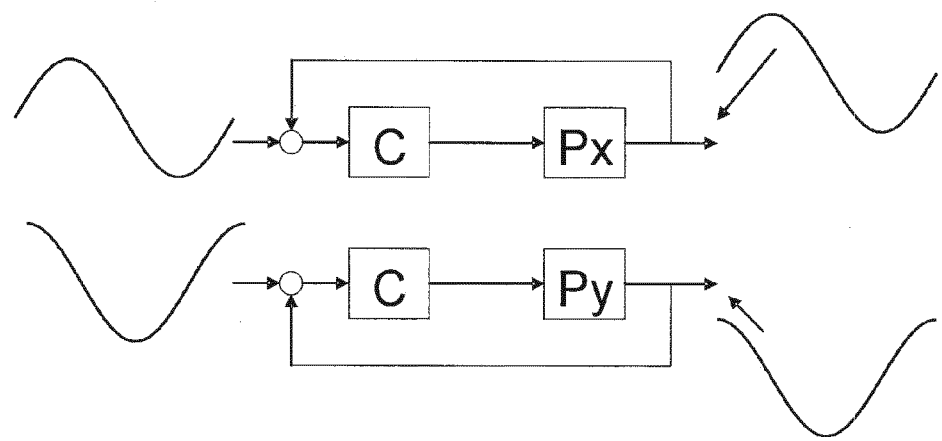
FIG. 10 depicts a control loop of a movable frame in a lithographic or exposure apparatus according to an embodiment of the invention.

Referring to FIG. 9, the controller C for the X-direction active magnetic bearing actuator Px should accept a sinusoidal response as a function of rotation, and the controller C for the Y-direction active magnetic bearing actuator Py should accept a cosine response as a function of position. But, in order not to react to these, referring to FIG. 10, the sine/cosine signals should be used to compensate the measured position/force, or be used as a controller C setpoint. The sinusoidal setpoint is generated such that it compensates the measured position/force due to unbalance, and hence the input of controller C remains zero in response to such a measured position/force. In an embodiment, no feedforward is used, since no force should be actuated. The result of such a "zero force" arrangement is little to no reaction forces, resulting in acceptably low position error.

The compensation applied should be calibrated. In an embodiment, such calibration may be performed using a low bandwidth controller while rotating at high speed. If the controller bandwidth is low enough, it does not react to the sinusoidal disturbance and so position/force measurement during rotation using the low bandwidth controller can be used as the unbalance calibration. The calibrated values can then be applied as a setpoint, and further measured positions/forces can be used iteratively to arrive at a better estimate. Alternatively, a notch can be implemented in the controller that filters the rotation frequency from the controller output. Also in that case, the measured positions/forces can be used as a setpoint and further measured positions/forces can be used iteratively to arrive at a better estimate.

In this embodiment, since the frame 8 may no longer rotate around the geometrical center 10, a deviation of where the beams are expected to impinge a target may be introduced. For example, a lens 14, 18 position deviation may be introduced. These deviations can be recorded using a sensor (e.g., a CCD camera) at the target level (e.g., using a sensor in the substrate stage or other stage or frame). The measurement can then be used to adjust the signal to control the modulation of the beams (e.g., control the "firing" of a radiation source 4) so as to impinge the target at the desired location.

Further, the (rigid body) dynamics of a high-speed rotor is governed by gyroscopic effects. For the two tilt directions Rx, Ry, this creates the terms "gyroscopic effect" identified below in Equation 1:

$$\begin{cases} J_t \ddot{\theta}_x + \omega_z J_z \dot{\theta}_y = T_x \\ J_t \ddot{\theta}_y - \underbrace{\omega_z J_z \dot{\theta}_x}_{\text{Gyroscopic effect}} = T_y \end{cases} \Rightarrow \begin{bmatrix} \theta_x \\ \theta_y \end{bmatrix} = P \cdot \begin{bmatrix} T_x \\ T_y \end{bmatrix} \quad (1)$$

where $\theta_x$ and $\theta_y$ are the rotations around the X and Y axes, $J_t$ is the inertia around the $\theta_x$ and $\theta_y$ axes, $J_z$ is the inertia around the Z axis, $\omega_z$ is the angular velocity around the Z axis, and $T_x$ and $T_y$ are the torques around the X and Y axes, respectively. The matrix P is described below in Equation 2:

$$P = \frac{1}{\underbrace{J_t(s^2 + \omega_{gyro}^2)}_{\text{Inertia} \quad \text{Stiffness}}} \cdot \begin{bmatrix} 1 & -\frac{\omega_{gyro}}{s} \\ \frac{\omega_{gyro}}{s} & 1 \end{bmatrix} \quad (2)$$

with $$\omega_{gyro} = \frac{J_z}{J_t} \omega_z$$

where s is the Laplace operator. The gyroscopic effect results in (1) a stiffness in the diagonal terms (instead of an inertia), depending on the rotation speed, and (2) a constant rotational velocity in one direction as a result of a constant torque in the other direction.

Figure 11:
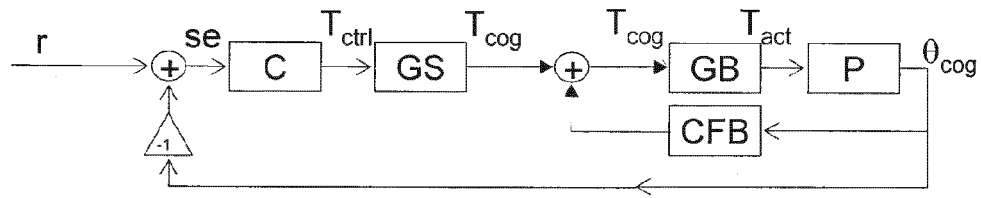
FIG. 11 depicts a control loop of a movable frame in a lithographic or exposure apparatus.

In an embodiment, the gyroscopic effect can be compensated in the control loop by a so-called "cross feedback", in which the measured velocity in one direction is fed back to a torque in the other direction. Referring to FIG. 11, the control loop comprises an inner loop that has a "cross feedback" term CFB, which acts on a measured rotor velocity in the $\theta_x$ and $\theta_y$ directions. The gain balancing matrix GB distributes the control forces over the actuators P, to create a decoupled system for the position controller C and the gain scheduling matrix GS.

Creation of the movable frame 8 velocity from a measured position thereof is difficult because the absolute velocity is needed, but a relative position of the frame 8 with respect to the stationary part is measured. Although the stationary part moves little, this difference can cause a significant problem in applying this technique. Hence, a differentiated position would be combined with an integrated stationary part acceleration. Because of measurement system noise, this may not be feasible.

Figure 12A:
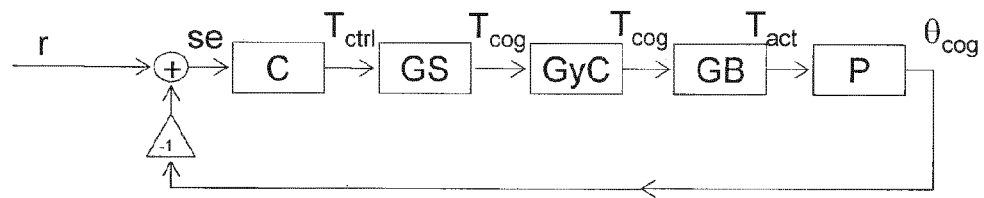
FIG. 12A depicts a control loop of a movable frame in a lithographic or exposure apparatus according to an embodiment of the invention.

Accordingly, in an embodiment of the invention, the gyroscopic effect is compensated not by feedback of a "cross feedback" term CFB but rather by a feedforward using so-called "gyroscopic compensation" GyC. Referring to FIG. 12A, a "gyroscopic compensation" GyC matrix is inserted between the gain scheduling matrix GS and the gain balancing matrix GB in the control loop. As a result, a highly accurate system may be achieved in which the gain balancing matrix GB distributes the control forces over the actuators P, in a feedforward decoupled system for the position controller C and the gain scheduling matrix GS. Thus, gyroscopic effects may be reduced or cancelled without determining or measuring the absolute velocity of the movable frame 8.

The GyC matrix is described in Equation 3 below:

$$P_{decoupled} = \begin{bmatrix} 1/J_t s^2 & 0 \\ 0 & 1/J_t s^2 \end{bmatrix} \quad (3)$$

$$GyC(s) = P_{cog}^{-1} \cdot P_{decoupled}$$

$$= \begin{bmatrix} 1 & \omega_{gyro}/s \\ -\omega_{gyro}/s & 1 \end{bmatrix}$$

This results in, as seen by the controller, Equation 4:

$$P_{cog} \cdot GyC = \frac{1}{J_t s^2} \begin{bmatrix} 1 & 0 \\ 0 & 1 \end{bmatrix} \quad (4)$$

Figure 12B:
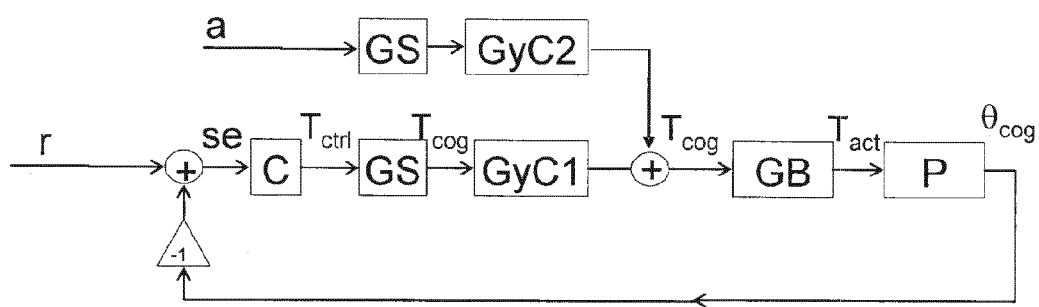
FIG. 12B depicts a variant of the control loop of FIG. 12A.

An exact GyC matrix as described above may in some circumstances lead to an unstable system. For example, instability may occur if $\omega_{gyro}$, (depending on the inertias) is not known exactly. Accordingly, a "detuned" GyC may be used in the feedback path to help create a stable system. For example, a high-pass filter may be included in the GyC compensation terms. The high-pass filter limits the gain of a pure integrator for low frequencies. Alternatively or additionally, a slightly lower GyC gain (e.g. 0.99 instead of 1.00) can be used to provide a stable closed loop. A disadvantage of tuning the GyC this way for stability, is a decreased performance of the feedforward. To help alleviate this, referring to FIG. 12B, the control loop of FIG. 12A may be used with a detuned GyC ("GyC1") and added thereto may be an exact GyC ("GyC2") applied in the setpoint feedforward.

Further, in an embodiment, reaction forces arising out of moving movable frame 8 should be reduced or eliminated. For example, the reaction forces should not be permitted to act directly on the supporting frame 5, 15. In a high accuracy application, a high controller bandwidth is used which can be severely disturbed by supporting frame dynamics in response to directly excited reaction forces. Accordingly, an isolation mechanism is desired. By an isolation mechanism is meant a mechanism that completely isolates the supporting frame 5, 15 from reaction forces or vibrations arising from moving the movable frame 8 (and/or completely isolates the movable frame 8 from vibrations or forces from the supporting frame 5, 15) or at least significantly reduces/dampens such reaction forces or vibrations arising from moving the movable frame 8 (and/or at least significantly reduces/dampens vibrations or forces from the supporting frame 5, 15). Such an isolation mechanism may comprise a reaction frame to which is connected the motor of the movable frame 8 in combination with a separate frame to which elements, that should be protected from the reaction forces or vibrations, are attached. The frames may be, for example, separately connected to ground or may be connected to each via a damper. Additionally or alternatively, one or more reaction masses (sometimes referred to as balance masses) may be used.

Referring to FIGS. 13A-D, an embodiment of a movable frame 8 system is shown schematically with one or more reaction masses 350 to absorb all or at least some of the reaction forces of the actuator 11. In this embodiment, as mentioned above, a stationary part 5 (e.g., a stiff rod) extends to the interior of the frame 8 such that the frame 8 rotates around the stationary part 5 and thus at least about the Z-axis. This movable frame 8 system may include one or more of the motors 300 as described above and have an active magnetic bearing. This movable frame 8 system may also include one or more sensors 312 as described above. In an embodiment, the stationary part 5 is stiffly connected to the frame 15. Since the frame 8 follows the one or more sensors between frame 8 and stationary part 5, the stationary part 5 is desirably stiffly connected to the frame 15 so that there is proper relation between the frame 15, to which the substrate motion may be referenced, and the frame 8. In an embodiment, the stationary part 5 may be connected to frame 15 via an isolation mechanism 352 (e.g., a damper in the form of, for example, a spring or gas mount), which may require additional differential measurements to establish a proper relation between the frame 8 and frame 15 (and/or other structures). The frame 15 may be connected to the ground via an isolation mechanism 354 (e.g., a damper in the form of, for example, a spring or gas mount), which may require additional differential measurements.

In this embodiment, the reaction mass 350 is movably connected to the stationary part 5. The reaction mass 350 may be connected to the stationary part 5 by, for example, a spring. Connected to the reaction mass is a part of the motor 300, while another part of the motor 300 is part of or connected to the frame 8. When the motor 300 is used to actuate the frame 8, reaction forces are absorbed by the reaction mass 350 such that all, or at least a significant amount, of the reaction forces do not transmit into the stationary part 5.

Figure 13A:
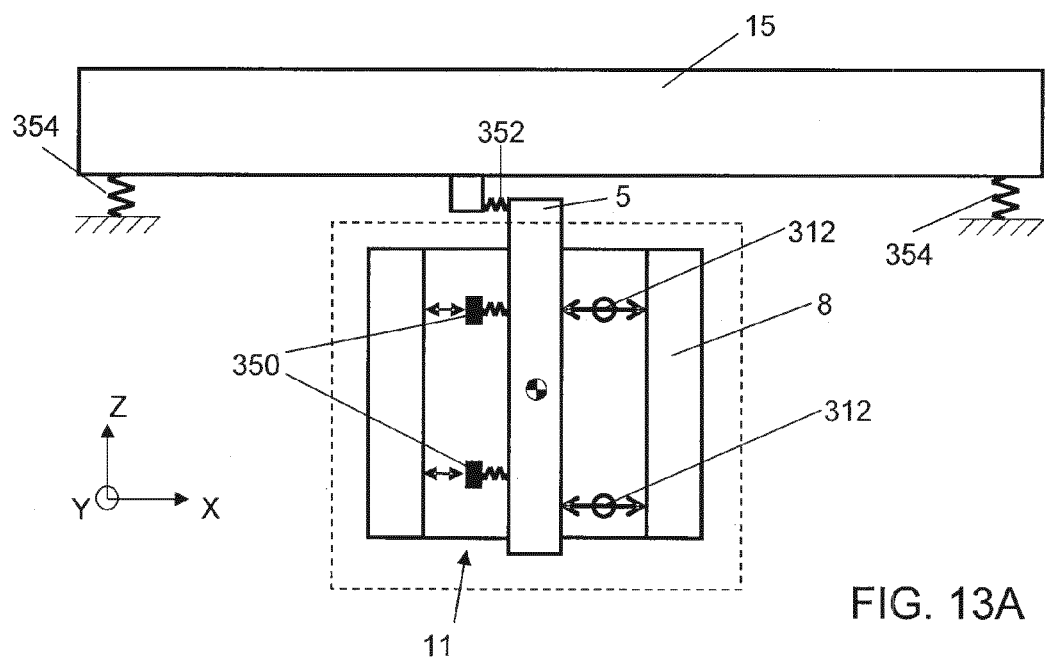
FIG. 13A depicts a schematic side view of a movable frame in a lithographic or exposure apparatus according to an embodiment of the invention.
Figure 13B:
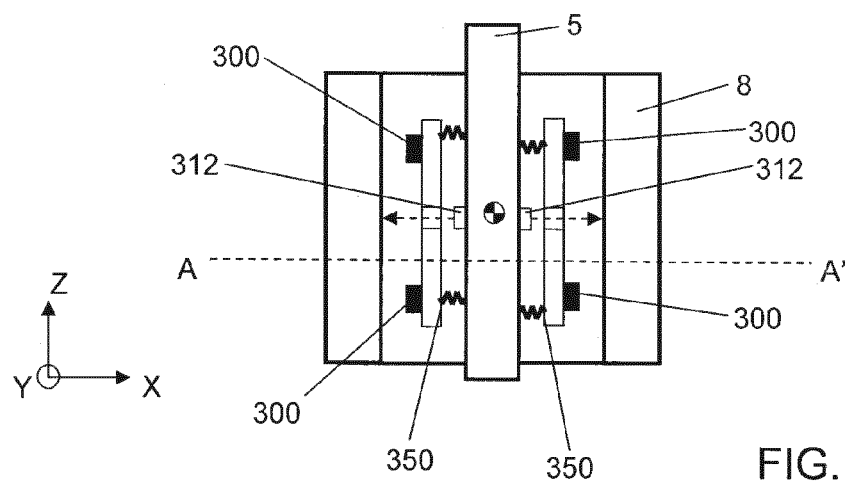
FIG. 13B depicts a detail of FIG. 13A.
Figure 13C:
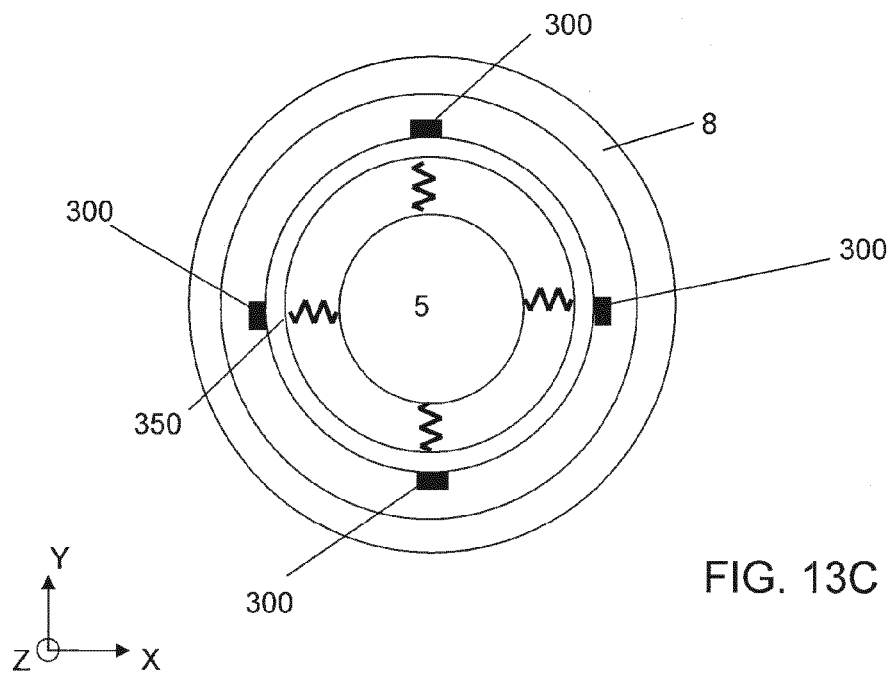
FIG. 13C depicts a schematic top view of FIG. 13B through line A-A'.

FIG. 13B depicts a schematic side view of an embodiment of the portion outlined by dashed box of FIG. 13A and FIG. 13C depicts a schematic top view of an embodiment of the portion outlined by dashed box of FIG. 13A. In this embodiment, a coil (electromagnet) part of the motor 300 is mounted in or on the reaction mass 350. While 4 coil parts of the motor 300 are shown, another number of coil parts may be provided. The coil part of the motor 300 interacts with the frame 8 to cause the frame to move. For example, the frame 8 may be made of steel such that the interaction of the coil part of the motor 300 with the frame 8 causes the frame 8 to move. Alternatively or additionally, a specific structure may be mounted in or on the frame that is the part of the motor 300 that cooperates with the coil part of the motor 300. In an embodiment, coil part of the motor 300 may be on the frame 8 and the other part of the motor 300 on the reaction mass 350.

In an embodiment, the reaction mass 350 may be a single monolithic structure (e.g., a cylinder that surrounds the stationary part 5) to which the one or more coil parts of the motor 300 are attached. In an embodiment, there may be one or more reaction masses 350, for example there may be 2, 3, 4 or more separate reaction masses. More than one coil part of the motor 300 may be mounted per reaction mass. In an embodiment, each coil part of the motor 300 has its own reaction mass 350.

In an embodiment, one or more of the reaction masses 350 may move in up to and including 6 degrees of freedom. In an embodiment, one or more of the reaction masses 350 may move in only 1, 2, 3 or 4 degrees of freedom.

In an embodiment, one or more sensors 312 are mounted on the stationary part 5 to measure the position of the movable frame 8 directly with respect to the stationary part 5. Each sensor 312 may measure in a single direction (e.g., Y-direction, X-direction, etc) or measure in multiple directions (e.g., X and Y directions). A gap may be provided internally to the reaction mass 350 to allow sensor 312 to measure the movable frame 8. Alternatively or additionally, a gap may be provided between a plurality of reaction masses 350 to allow sensor 312 to measure the movable frame 8.

Figure 14:
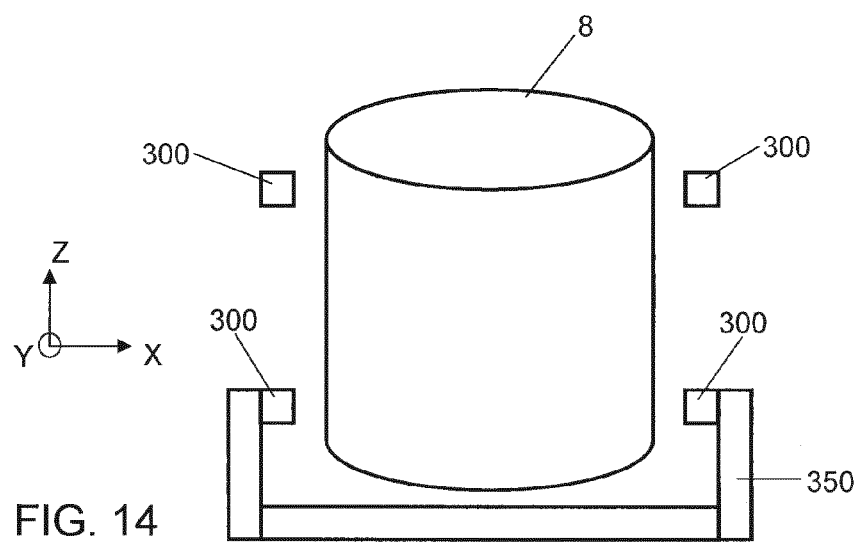
FIG. 14 depicts a schematic side view of a movable frame in a lithographic or exposure apparatus according to an embodiment of the invention.

Referring to FIGS. 13C and 14, for each actuation direction, at least two motors 300 (e.g., reluctance motors) may be provided—one at each opposite side of the rotor (see also, e.g., the upper set of motors 300 in FIG. 7, the lower set of motors 300 in FIG. 7, the upper set of motors 300 in FIG. 13B or the lower set of motors 300 in FIG. 13B). A reason for this is that the particular motor may exert a unidirectional force. In an embodiment, referring to FIG. 14, the at least two motors 300 for a particular actuation direction are connected to a same reaction mass 350. This arrangement allows a higher mass of the total reaction mass, limiting its excursions.

Figure 13D:
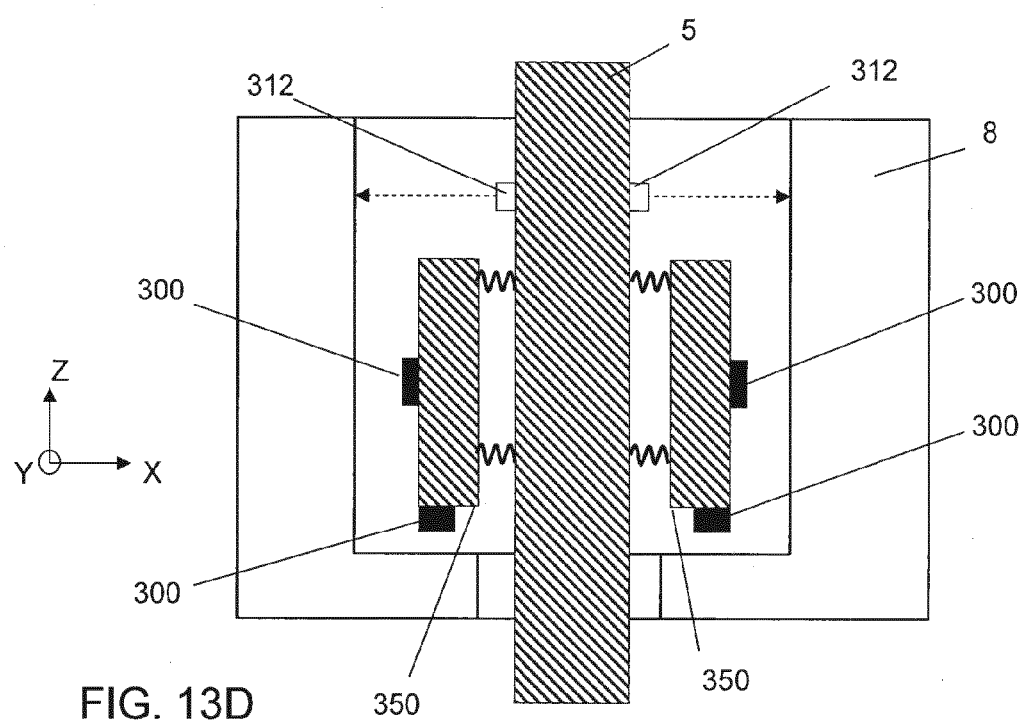
FIG. 13D depicts a schematic side view of a movable frame in a lithographic or exposure apparatus according to an embodiment of the invention.

In FIG. 13D, a variation of the embodiment depicted in FIG. 13B is shown. Like in FIG. 13B, a part of the motor 300 is mounted in or on the reaction mass 350. In this case, the 2 depicted upper parts of the motor 300 cause movement of the frame 8 in the X-direction while 2 further upper parts of the motor 300 (not shown but at 90 degrees to the two depicted upper parts of the motor 300) cause movement of the frame 8 in the Y-direction. The 2 depicted lower parts of the motor 300 cause movement of the frame 8 in the Z-direction. In an embodiment, a further lower part of the motor 300 may be provided to cause movement in the Z-direction. With 3 or more parts of the motor 300 to cause movement in the Z-direction, the motor 300 can actuate in the Z, Rx and Ry directions. In an embodiment, the parts of the motor 300 may cause the frame to rotate around the Z-axis. In an embodiment, each or all of the parts of the motor 300 may be parts of a reluctance motor. Like FIG. 13B, one or more sensors 312 are mounted on the stationary part 5 to measure the position of the movable frame 8 directly with respect to the stationary part 5. In this case, the sensor 312 is mounted outside of the periphery of the reaction mass 350 in order to measure the frame 8.

Figure 15:
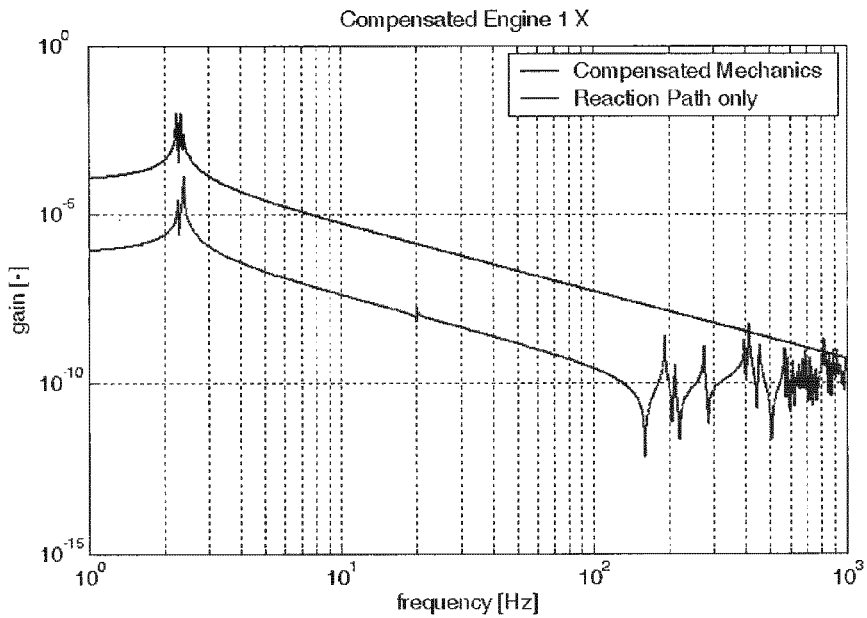
FIG. 15 depicts a Bode plot of a movable frame in a lithographic or exposure apparatus according to an embodiment of the invention without a reaction mass.
Figure 16:
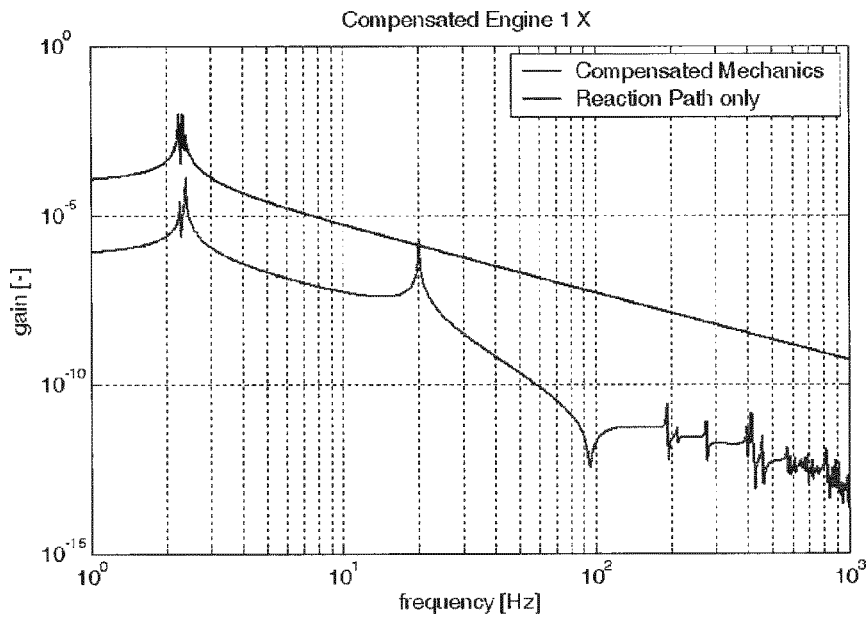
FIG. 16 depicts a Bode plot of a movable frame in a lithographic or exposure apparatus according to an embodiment of the invention with a reaction mass.

By using one or more reaction masses 350, a stable system at the desired bandwidth may be obtained. Reaction forces can be filtered before entering the stationary part 5, enabling high servo control bandwidth and small position error. In an embodiment, the system may have a reaction mass 350 of 1 kg at 20 Hz, a stationary part 5 of 10 kg at 500 Hz, a movable frame 8 of 80 kg, a frame 15 of 5000 kg at 150 Hz and a gas mount 354 for 1.5-3 Hz. In such a system, a stable system with low or no reaction forces in the stationary part 5 may be achieved. Referring to FIG. 15, a Bode plot of simulated data shows, for example, the mechanical transfers in the X-direction without a reaction mass. Without a reaction mass, the reaction path starts to approach the action path above 200 Hz. Referring then to FIG. 16, a Bode plot of simulated data shows the mechanical transfers in the X-direction with a reaction mass. With the reaction mass, the reaction path remains away from the action path above 200 Hz. Further, it can be seen from FIG. 16 that the reaction mass may not address frequencies below 20 Hz, because this range of frequencies shouldn't affect stability due to the lack of resonances. Additionally, referring to FIG. 16, the reaction path is amplified at about 20 Hz, i.e., the reaction forces are amplified, however this is lower than the bandwidth of the control system and so does not have a significant deleterious effect. Frequencies about or less than 20 Hz can be addressed, if needed, in another manner (e.g., damping). As for frequencies above about 20 Hz, the reaction mass is effective at keeping the reaction path away from the action path.

In operation, the forces may sometimes be too large to be absorbed by the reaction mass; the excursion of the reaction mass may become too large. This may be the case, for example, (1) when tracking a 6-degrees of freedom profile by the movable frame 8 (e.g., maintaining the movable frame 8's appropriate position and orientation with the respect to the substrate, e.g., leveling) and/or (2) when large repeating disturbances need to be compensated, e.g. characteristics from a gravity compensator acting in the Z direction to position the movable frame 8 along the Z-axis).

Figure 17:
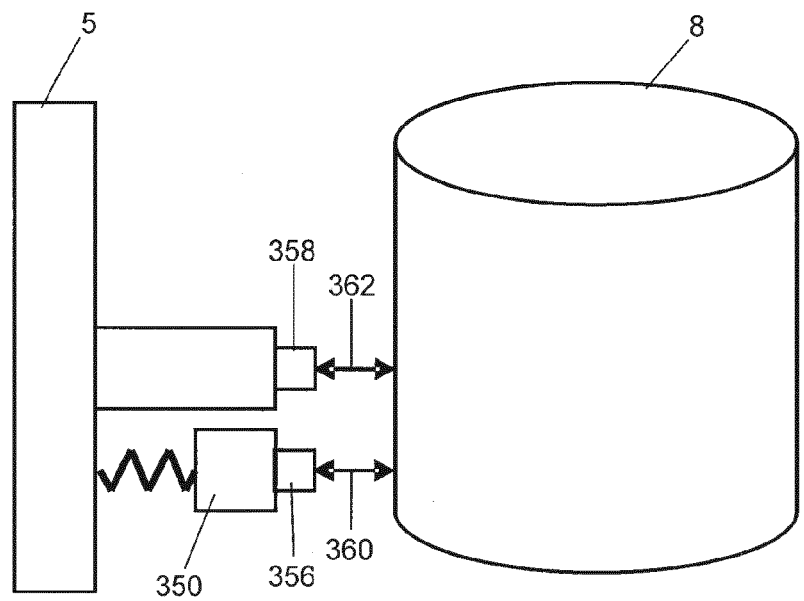
FIG. 17 depicts a schematic side view of a part of a movable frame in a lithographic or exposure apparatus according to an embodiment of the invention.

A possible solution is to use at least two motors 356, 358 in place of where one motor 300 would be used. Referring to FIG. 17, the first motor 356, connected to the reaction mass 350, only applies servo feedback forces 360. The second motor 358, connected directly to the stationary part 5, only applies servo feedforward forces 362. The servo feedforward forces are much higher, but do not need to be isolated by a reaction mass since they cannot destabilize the control loop. Further in this type of arrangement, since the motor 356 connected to the reaction mass 350 would only apply a relatively small force, a bias current can be used on the corresponding opposing motor. An actuated force then is translated into a larger current in one motor, and a smaller current in another motor. This may mean no need to switch amplifiers from one motor to the next.

In an embodiment, the movable frame 8 may suffer from internal dynamics that interferes with obtaining high controller bandwidth. Accordingly, it is desirable to obtain higher bandwidth, which can lead to better accuracy and better accuracy. The following measures can help to achieve such higher bandwidth, better accuracy, and/or better imaging.

Figure 18:
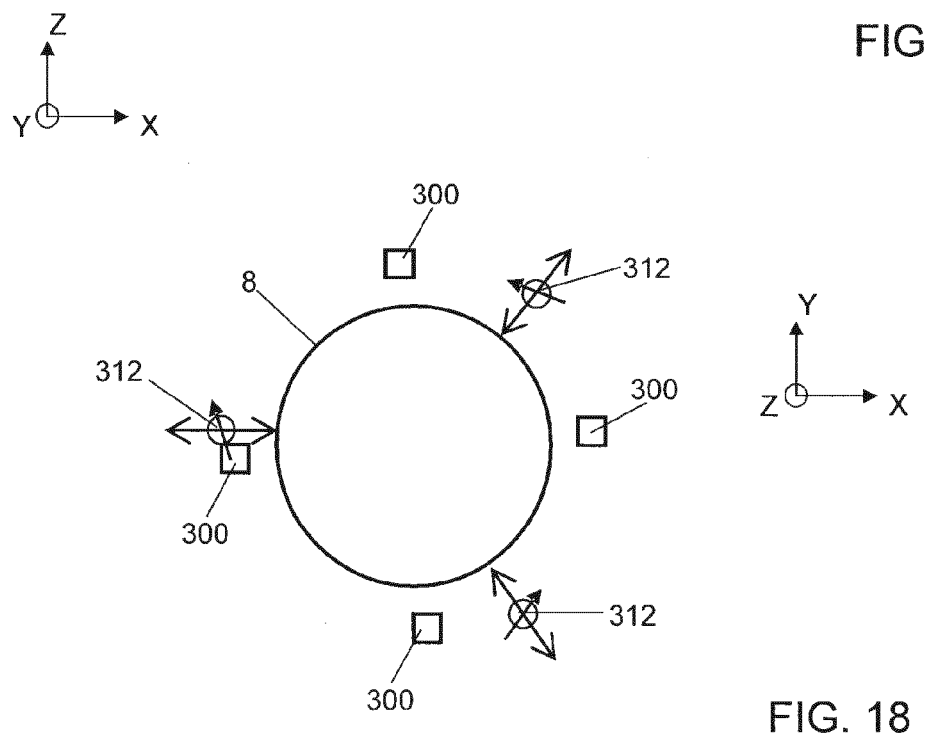
FIG. 18 depicts a schematic top view of a movable frame in a lithographic or exposure apparatus.

FIG. 18 depicts a schematic top view of a movable frame with a plurality of motors 300 (e.g., 4 motors such as reluctance motors) evenly spaced around a part of the frame 4. For example, in the example of FIG. 18, motors 300 are located at the 0°, 90°, 180° and 270° positions. Further, FIG. 18 also depicts a plurality of sensors 312 (e.g., 3 sensors) to measure a position/force of the movable frame 8 in the X, Y directions. The sensors are evenly spaced around a part of the frame 4. For example, in the example of FIG. 18, the sensors 312 are located at the 45°, 165°, and 285° positions.

Figure 19:
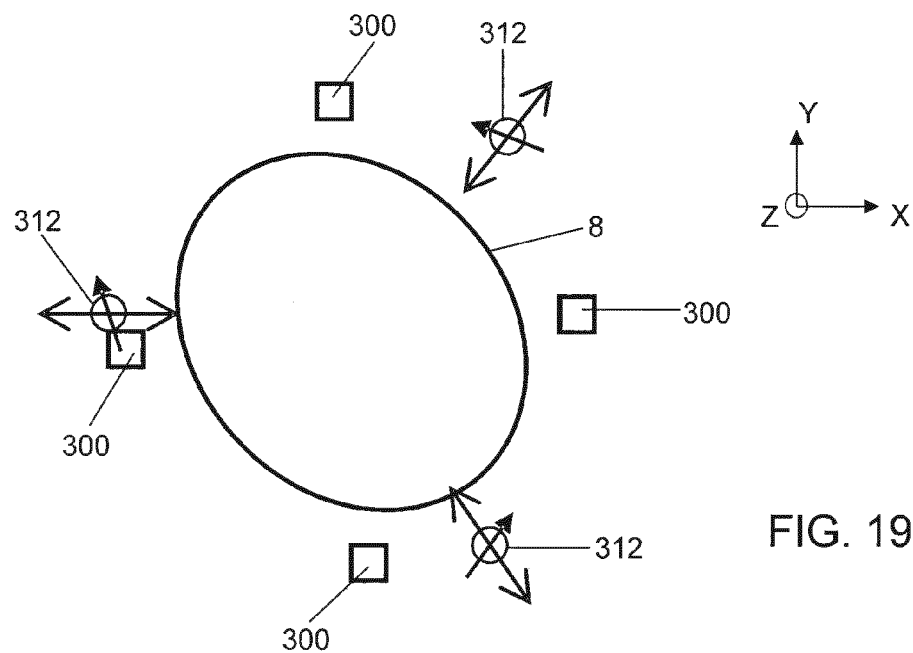
FIG. 19 depicts a schematic top view of a movable frame in a lithographic or exposure apparatus.

Referring to FIG. 19, the frame 8 of FIG. 18 is shown being rotated. During motion, the movable frame 8 may adopt, as one of its modes, an ellipsoidal shape at a certain frequency as shown in FIG. 19. This shape is picked up by the sensors 312 and actuated by the motors 300, and will hence show up in the mechanical system that the controller tries to control. Such a mode and/or other low modes become "visible" in the control loop and thus made lead to reduced bandwidth. A low bandwidth may result in larger positioning errors, and in the case of a rotatable frame 8 may lead to instability at a high rotation speed.

In an embodiment, it is desired that either such a mode (and/or other low modes) are not observed by the sensors 312 and/or not actuated by the motors 300, and thus essentially removed from the servo open loop. In an embodiment, to effect this, a sensor is located at an angular position that substantially bisects the angular positions of two adjacent motors. For example, if adjacent motors are located at the 0° and 90° positions respectively, the sensor is located at about the 45° position. So, referring to FIG. 20, in an embodiment, the motors 300 are located at the 0°, 90°, 180° and 270° positions such as shown in FIGS. 18 and 19. However, there are now 4 sensors 312, which are located at the 45°, 135°, 225° and 315° positions. In this arrangement, as will be shown below in relation to FIGS. 21(A)-(D), an ellipsoidal mode shape is now: not observed as an ellipsoid by the sensors 312, or not actuated as an ellipsoid by the motors 300, and hence is removed from the servo open loop. FIGS. 21(A) and 21(B) show some mode shapes of frame 8 that are actuated by one or more of the motors 300, but not observed as an ellipsoid by the sensors 312. Referring to FIGS. 21(C) and (D), when the movable frame 8 rotates (from the orientation in FIG. 21(A) to that in FIG. 21(C) or from the orientation in FIG. 21(B) to that in FIG. 21(D)), the ellipsoid mode of the movable frame 8 becomes observable by one or more of the sensors 312 as an ellipsoid, but cannot be actuated by one or more of the motors 300 as an ellipsoid.

Figure 20:
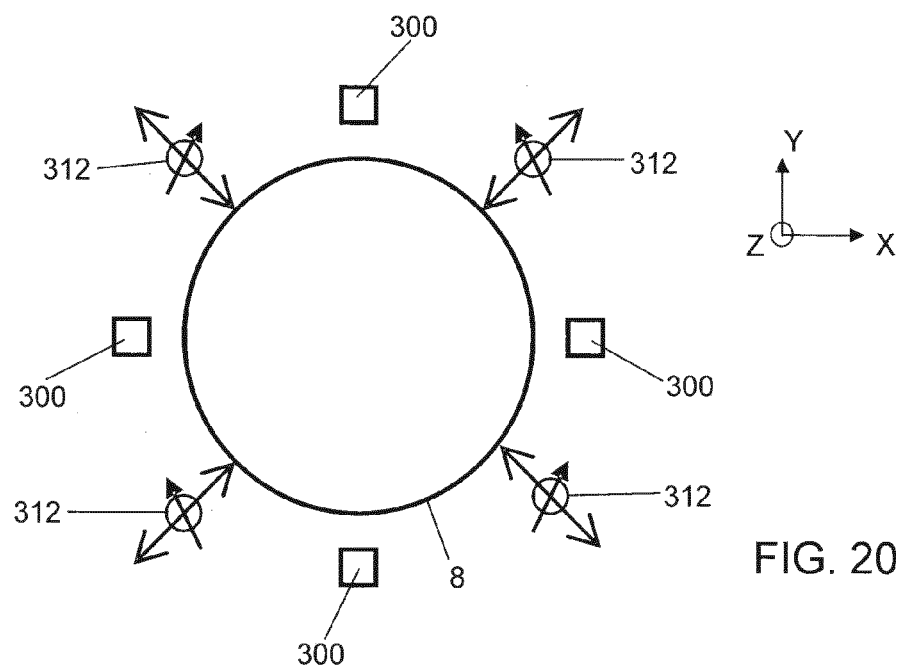
FIG. 20 depicts a schematic top view of a part of a movable frame in a lithographic or exposure apparatus according to an embodiment of the invention.
Figure 22:
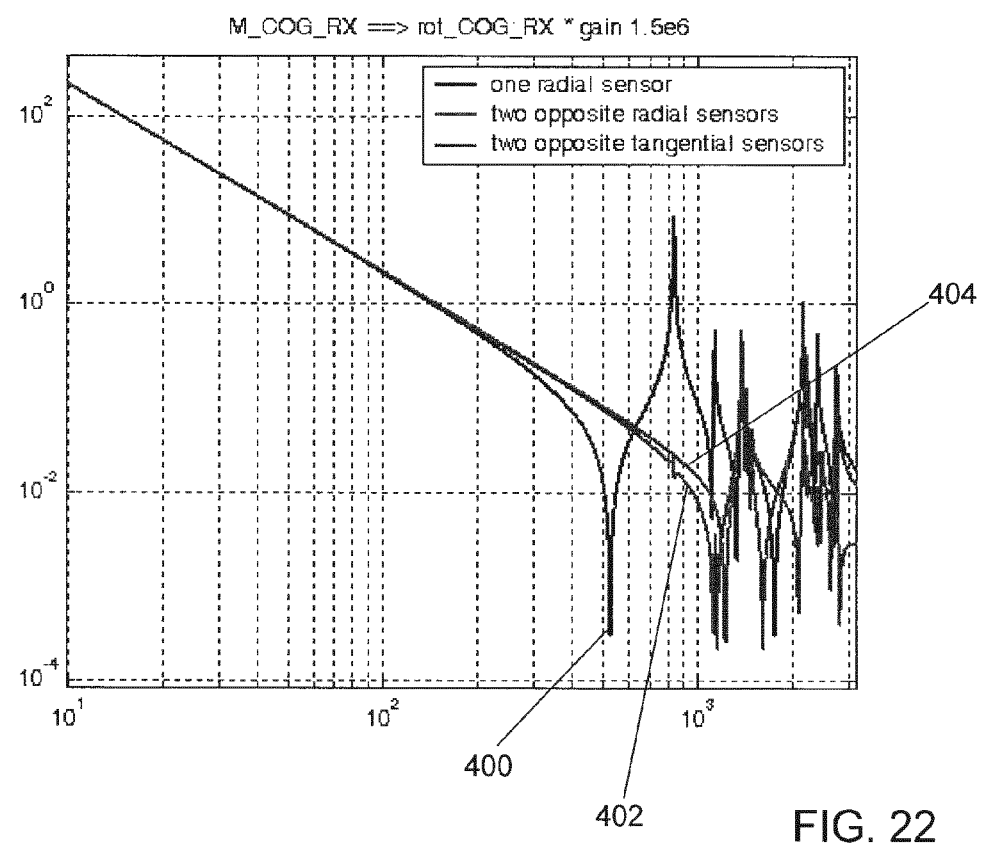
FIG. 22 depicts a Bode plot of a movable frame in a lithographic or exposure apparatus comparing a sensor arrangement according to an embodiment of the invention with another sensor arrangement.

Referring to FIG. 22, a Bode plot depicts simulated results using a dynamic model of a rotor with and without the motor 300/sensor 312 orientation of FIG. 20. Curve 400 shows the normal response without the motor 300/sensor 312 orientation of FIG. 20. Curve 402 shows the response with the motor 300/sensor 312 orientation of FIG. 20, wherein sensors 312 are radial sensors. Curve 404 shows the response with the motor 300/sensor 312 orientation of FIG. 20, wherein sensors 312 are tangential sensors. It can be seen, for example, that the about 830 Hz mode in curve 400 is no longer apparent in curves 402 and 404.

Figure 23:
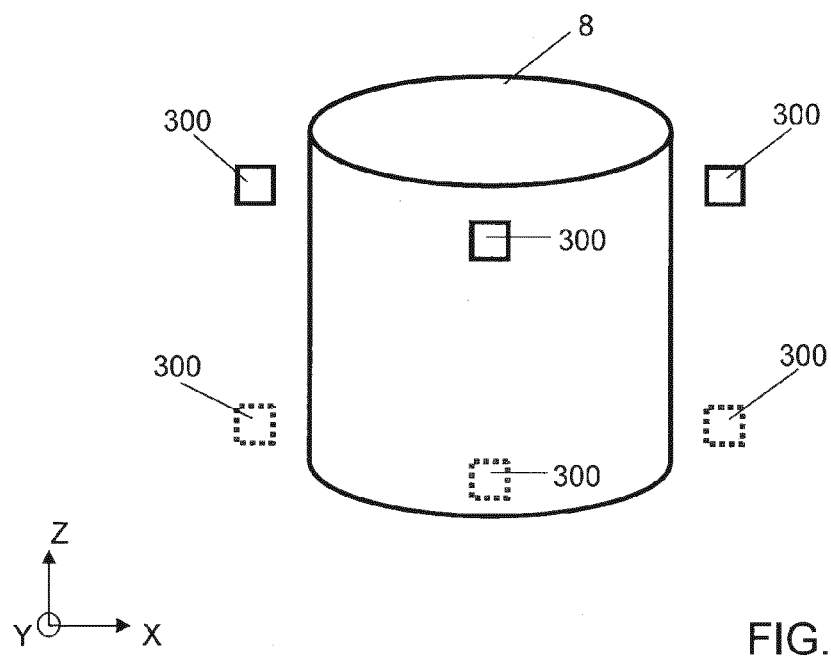
FIG. 23 depicts a schematic side view of a part of a movable frame in a lithographic or exposure apparatus.

Further, in an embodiment, referring to FIG. 23, eight motors 300 (e.g., reluctance motors) are used to obtain X and Y displacements, and Rx and Ry rotations. A first set of four motors 300 (shown as dashed line squares) is at or close to the top of the movable frame 8, while a further set of four motors 300 (shown as solid line squares) are at or close to the bottom of the movable frame 8. It is possible to use more than four motors 300 (e.g., eight total motors 300) both on the top and bottom of the movable frame 8 to actively control the movable frame 8 modes. This form of overactuation can be combined with adding extra sensors 312.

Figure 24:
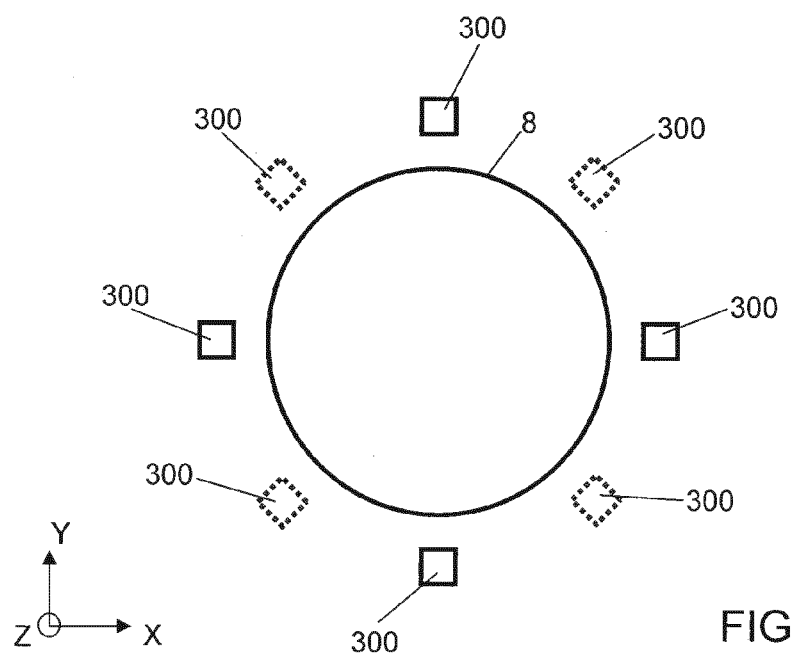
FIG. 24 depicts a schematic side view of a part of a movable frame in a lithographic or exposure apparatus according to an embodiment of the invention.

However, to help avoid the top and bottom sets of motors 300 exciting a mode of the movable frame 8 (e.g., the ellipsoidal mode) and referring to FIG. 24, each motor of the bottom set of motors 300 (shown as dashed line squares) is located at an angular position that substantially bisects the angular positions of two adjacent motors of the top set of motors 300 (shown as solid line squares). For example, referring to FIG. 24, if adjacent motors 300 of the top set of motors 300 are located at the 0° and 90° positions respectively, a motor of the bottom set of motors 300 is located at about the 45° position. In effect, the bottom set of motors 300 is rotated about 45 degrees with respect to the top set of motors 300. Now, if a X, Y, Rx or Ry force is applied, only the top set of motors 300 or the bottom set of motors 300 may excite the mode, but not both at the same time.

As discussed above, during motion, the movable frame 8 may suffer from bandwidth limiting internal dynamics. For example, movable frame 8 may adopt, as one of its modes, an ellipsoidal shape at a certain frequency. This shape can be picked up by the sensors 312 shown in FIG. 19 and actuated by the motors 300, and will hence show up in the mechanical system that the controller tries to control. Such a mode and/or other low modes become "visible" in the control loop and thus may lead to reduced bandwidth. A low bandwidth may result in larger positioning errors, and in the case of a rotatable frame 8 may lead to instability at a high rotation speed.

Figure 21:
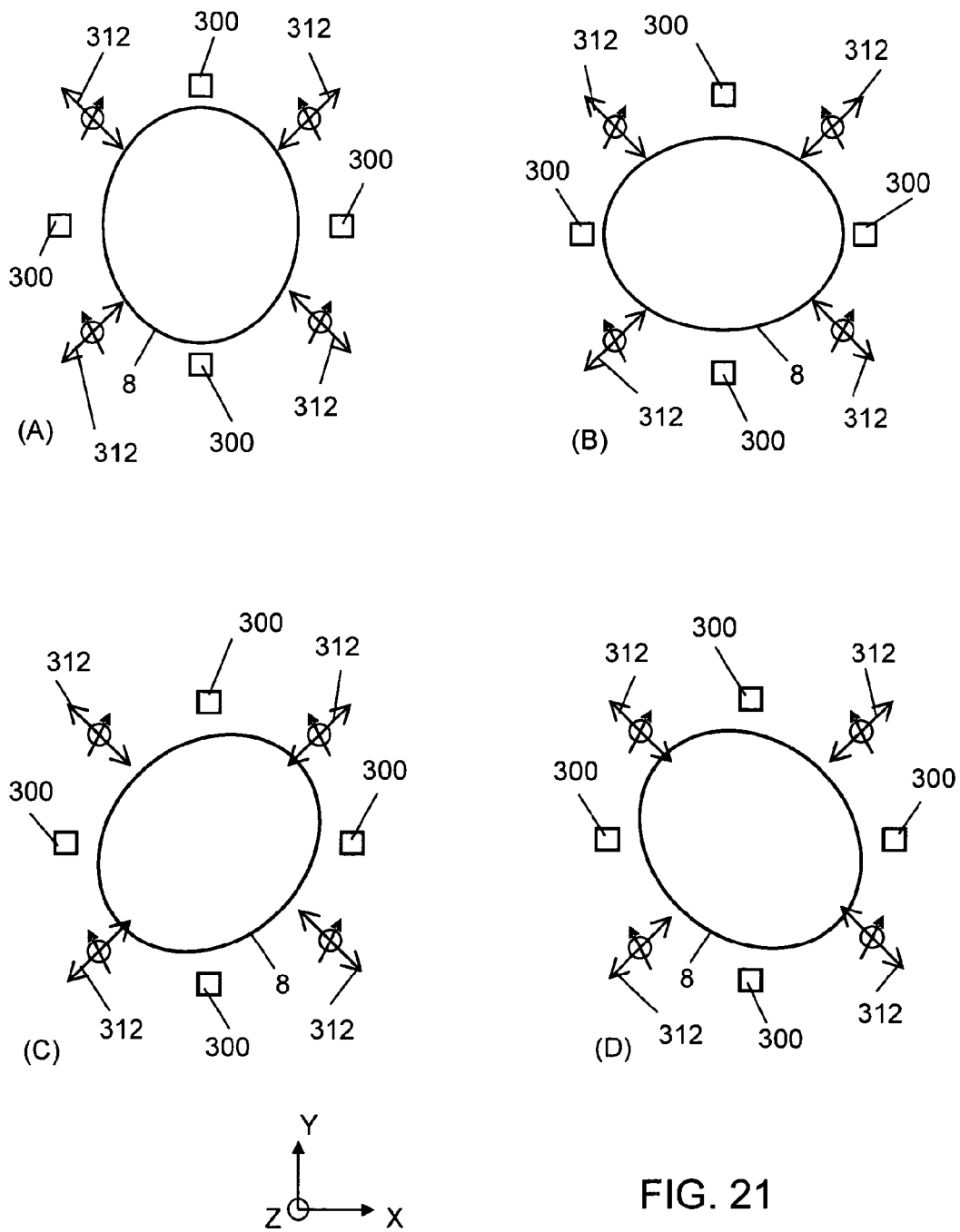
FIGS. 21(A)-21(D) depicts a schematic top view of a part of a movable frame in a lithographic or exposure apparatus according to an embodiment of the invention.

As discussed above, a solution is to have certain (i.e. low frequency) mode shapes be unobserved and/or not be actuated as those mode shapes. In an embodiment, a plurality of individual sensor signals are combined to generate unobservability, e.g., by means of averaging. For instance, as discussed above with respect to FIG. 21, averaging can make a mode shape "unobservable" and/or not be actuated as that mode shape when sensors are placed opposite of one another (i.e., at 180 degrees with respect to each other relative to a center of the frame) and the mode shape is also opposite on those positions, and thus the sensors measure a 180 degrees phase shifted error signal. For example, as depicted in FIG. 21, an ellipse mode shape with arbitrary rotation can become "unobservable" using a first set of two sensors opposite each other along a first direction and a second set of two sensors opposite each other along a second direction, the second direction of the second set being substantially perpendicular to the first direction of the first set. In an embodiment, more than two sets of sensors may be employed to measure the position of the frame and facilitate making a mode shape of the frame "unobservable" and/or not be actuated as that mode shape. Those additional sets of sensors may be used to make the measurement more accurate and/or to make the frame more "unobservable" and/or less actuated as that mode shape. Additionally or alternatively, the additional sets may be used to make a mode shape of the frame "unobservable" and/or not be actuated as that mode shape where two sets may not be able to, for example, if the mode shape is not an ellipse or not a uniform ellipse. Further, a set of sensors may comprise more than two sensors. More than two sensors in a set may be used, for example, to measure an irregular ellipse mode shape (e.g., an ellipse type shape that is not uniformly elliptical). When more than two sensors are combined, appropriate sensor positioning and mathematics (e.g., using information regarding the location of the sensors, the expected mode shape, and/or angular position of the frame (e.g., the timing of the sensor measurements relative to the rotational position of the frame)) would be used to combine the measurements to yield signals without observing a mode shape and/or not actuated the frame as that mode shape.

In a further embodiment, tangential metrology is used to measure in a direction substantially perpendicular to a direction of mode shape manifestation, which facilitates making the mode shape to be unobserved and/or not be actuated as the mode shape. This is because measurement in a tangential direction is (rather) insensitive to the mode shape, which manifests itself mainly in a radial direction (e.g. an ellipsoidal mode shape). By tangential metrology is meant measurement at a tangent to a surface of the frame and/or to a radius from the axis of rotation. A surface of the frame 8 used for measurement with tangential metrology need not be a curved (e.g., circular arc) surface nor need it be an outer surface of frame 8.

Figure 25:
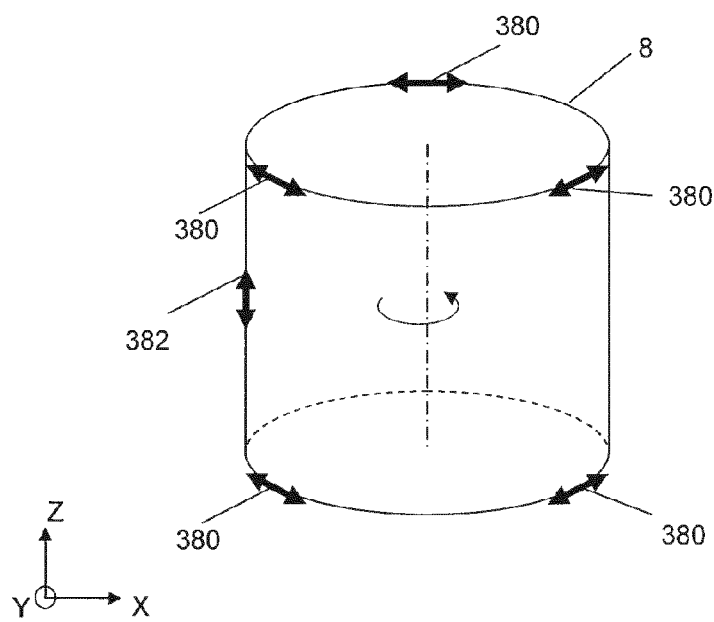
FIG. 25 depicts a schematic side view of a part of a movable frame in a lithographic or exposure apparatus.

Referring to FIG. 25, one or more tangential sensors 380 are provided to measure the frame 8 in a substantially tangential direction. In an embodiment, five tangential sensors 380 are provided to allow for five degrees of freedom (X, Y, Rx, Ry, and Rz) measurement and thus control of positioning in the five degrees of freedom. As shown in FIG. 25, three tangential sensors 380 are evenly spaced around the rotation axis of the frame 8 at the top half of the frame 8. A further two tangential sensors 380 are spaced around the rotation axis of the frame 8 at the bottom half of the frame 8. In an embodiment, the three tangential sensors 380 may be at the bottom half of the frame 8 and the two tangential sensors 380 may be at the top half of the frame 8. An additional sensor 382 is provided for axial (Z-direction) measurement and thus control of positioning in the axial direction.

In an embodiment, one or more of the sensors 380, 382 may be an encoder system. In embodiment, the scale of the encoder system is in or on the frame 8 and the sensor, transducer or readhead of the encoder system is on the stationary part 5 and/or frame 15. In a variant, the scale of the encoder system is in or on the stationary part 5 and/or frame 15 and the sensor, transducer or readhead of the encoder system is on the frame 8. In an embodiment, one or more of the sensors 380, 382 may be a capacitive sensor, an Eddy current sensor, or a confocal sensor. In an embodiment, each of the sensors 380 is an encoder system and sensor 382 is a capacitive sensor, an Eddy current sensor, or a confocal sensor.

Figure 26:
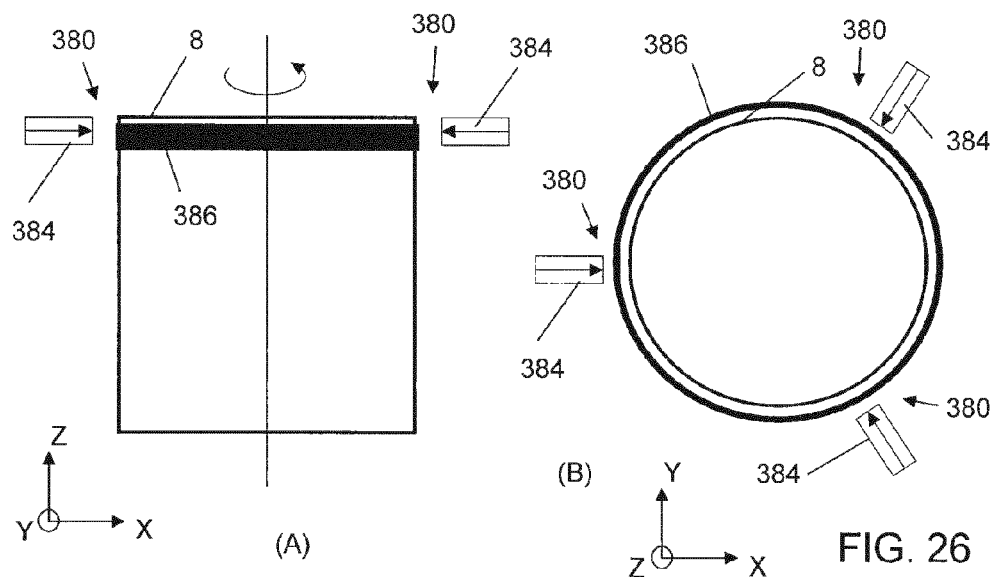
FIGS. 26(A) and 26(B) depict, respectively, a schematic side and top view of a part of a movable frame in a lithographic or exposure apparatus.

Referring to FIGS. 26(A) and (B), a side view and a top view of a schematic frame 8 according to an embodiment of the invention are depicted. In this case, frame 8 is circular, but it need not be. As seen in FIG. 26(A), each tangential sensor 380 comprises a sensor, transducer or readhead 384 in combination with a scale 386. In this case, the scale 386 is attached to the frame 8. Depicted in FIG. 26(A) are two of the tangential sensors 380 associated with the top half of the frame 8 and depicted in FIG. 26(B) are depicted the three tangential sensors 380 associated with the top half of the frame 8. The two tangential sensors of the bottom half of the frame 8 are not depicted in FIG. 26 for convenience only. Further, it can be seen that, in this embodiment, the scale 386 is attached to a lateral outer surface of the frame 8 with the sensors, transducers or readheads 384 arranged with their sensing surfaces facing, in the direction shown by the respective arrows, at the scale 386; as will be appreciated, the scale 386 could on or in another surface of frame 8. Further, while the scale 386 is shown as being continuous, it need not be. For example, the scale 386 may be segmented around the outer lateral surface of frame 8 into subscales 386 that are, for example, each associated with a particular sensor, transducer or readhead 384. In an embodiment, the scale 386 comprises a linear grating. Through the combined readings of the tangential sensors 380 depicted in FIG. 26, the movement in the X and/or Y directions of frame 8 can be determined as well as rotation around the Z-axis. In combination with similar tangential sensors 380 on the bottom half of frame 8, movement around the X and/or Y directions of frame 8 can be determined.

Figure 27:
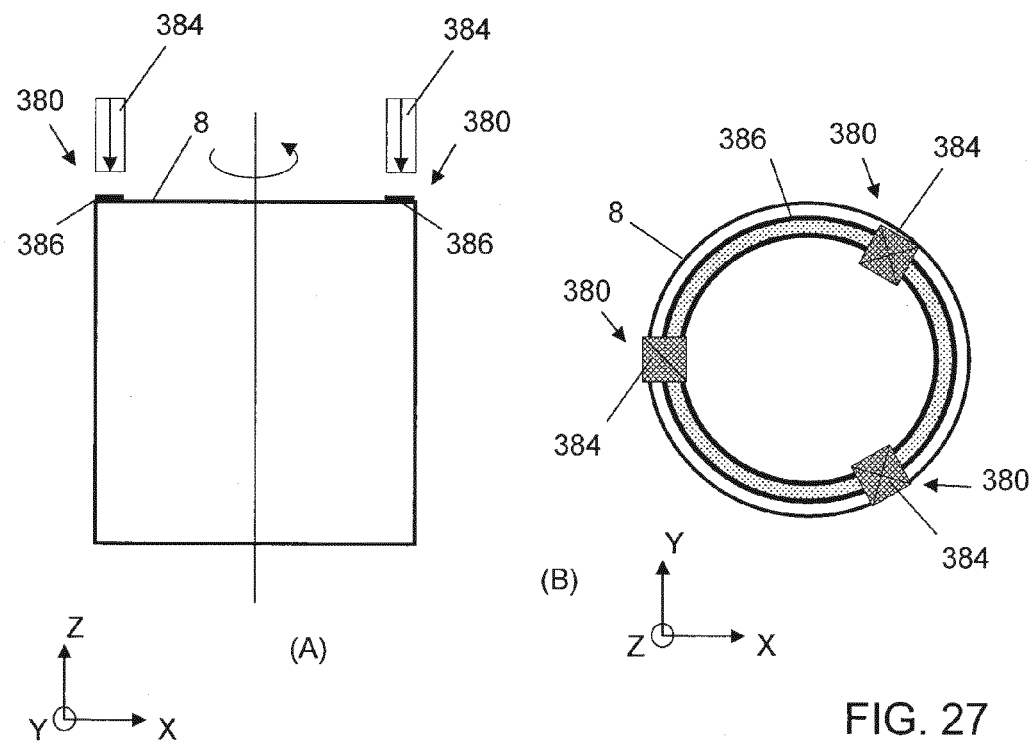
FIGS. 27(A) and 27(B) depict, respectively, a schematic side and top view of a part of a movable frame in a lithographic or exposure apparatus.

Referring to FIGS. 27(A) and (B), a side view and a top view of a schematic frame 8 according to an embodiment of the invention are depicted. In this case, frame 8 is circular, but it need not be. As seen in FIG. 27(A), each tangential sensor 380 comprises a sensor, transducer or readhead 384 in combination with a scale 386. In this case, the scale 386 is attached to the frame 8. Depicted in FIG. 27(A) are two of the tangential sensors 380 associated with the top half of the frame 8 and depicted in FIG. 27(B) are depicted the three tangential sensors 380 associated with the top half of the frame 8. The two tangential sensors of the bottom half of the frame 8 are not depicted in FIG. 27 for convenience only. Further, it can be seen that, in this embodiment, the scale 386 is attached to an outer top (or bottom) surface of the frame 8 with the sensors, transducers or readheads 384 arranged with their sensing surfaces facing, in the direction shown by the respective arrows, at the scale 386. Further, while the scale 386 is shown as being continuous, it need not be. For example, the scale 386 may be segmented around the outer top (or bottom) surface of frame 8 into subscales 386 that are, for example, each associated with a particular sensor, transducer or readhead 384. In an embodiment, the scale 386 comprises a linear grating. Through the combined readings of the tangential sensors 380 depicted in FIG. 27, the movement in the X and/or Y directions of frame 8 can be determined as well as rotation around the Z-axis. In combination with similar tangential sensors 380 on the bottom half of frame 8, movement around the X and/or Y directions of frame 8 can be determined.

A combination of the arrangements depicted in FIGS. 26 and 27 may be employed. For example, the arrangement of one or more tangential sensors 380 shown in FIG. 26 may be used for the top half of a frame 8, while the arrangement of one or more tangential sensors 380 shown in FIG. 27 may be used for the bottom half of the frame 8, or vice versa. Other combinations will be apparent to those skilled in the art.

An advantage of a tangential sensor is its relative insensitivity for radial variation (e.g. in view of range dissipation) resulting from and dependent on angular velocity. For the angular velocities under consideration herein, the variations may be in the order of 100 microns. Insensitivity to radial variation (expansion or contraction) can yield higher accuracy in position measurement and thus position control. Thus, a mode shape manifesting itself in a radial direction is essentially unobservable using a tangential sensor, allowing for a higher bandwidth, and as such improved position- and imaging accuracy. Moreover, a tangential sensor can have an advantage over a sensor measuring in the radial direction in that the radial sensor will likely have a curved measurement surface, thus limiting accuracy.

An advantage of an encoder system in this application is its stand-off distance (i.e., the distance between encoder head and scale). The relatively large stand-off distance of an encoder system can increase robustness for (i) emergency stops (e.g., frame 8 crash) and/or (ii) assembly/serviceability. For example, the stand-off distance for an encoder system for high resolution measurement (e.g., 10 nm resolution) can be in the order of millimeters (even up to 10 mm) compared to a nominal stand-off distance for, e.g., a capacitive sensor of approximately $10^5\times$ resolution, which translates to a stand-off distance of about 0.1 mm when the resolution is about 10 nm. Further, an optical sensor, such as an encoder system, will not be influenced by magnetic fields generated by, for example, actuators.

An advantage, in addition to or alternatively from insensitivity to radial variation, is that the number of sensors may be reduced compared to, e.g., a system that measures radially. Reduction in the number of sensors can (i) reduce noise (and increase accuracy), and/or (ii) reduce cost and yield. However, it is not necessary that the number of sensors be reduced and indeed having a greater number of sensors (at the sake of, for example, cost) may mean less noise if averaging of the sensor is employed. Noise reduces with the inverse square root of the number of sensors used and so more sensors means less noise in the total result.

As discussed above, a movable frame 8 is desirably balanced to reduce or minimize unbalance in the frame 8 (e.g., balanced by strategically adding weight or removing weight similar to balancing of a vehicle tire); the frame 8 should be very well mechanically balanced. For example, each frame 8 may be balanced to, e.g., 2 kg*μm. By such balancing, not only is the potential deleterious effect of imbalance on the frame 8 itself minimized or reduced but additionally or alternatively the effect of the frame 8 on the supporting frame 5, 15, on another frame 8, and/or on one or more other components in the apparatus 1 can be minimized or reduced.

Figure 28:
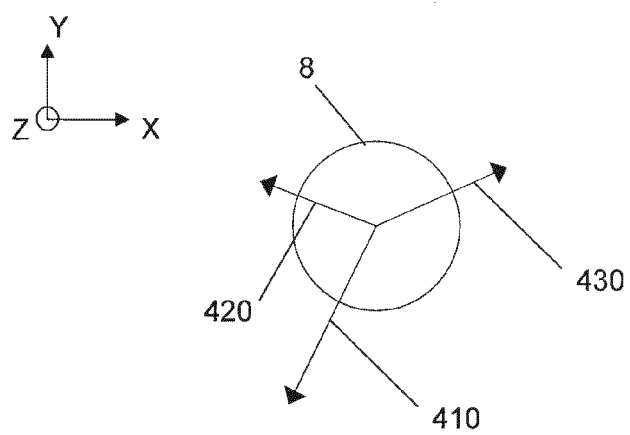
FIG. 28 depicts a schematic representation of an imbalance force and associated offsets associated with a frame 8.

Despite balancing of the frame 8, some unbalance may remain. Referring to FIG. 28, a frame 8 has an imbalance of some amount (even if very small) resulting in application of a net force to the frame 5, 15 by the frame 8. The net force applied by each frame 8 is symbolically depicted by the vector 410 associated with the frame 8. The vector is merely exemplary of the net direction and magnitude of the force; the vector may be of different direction and/or magnitude and the actual force may be time-varying in direction and magnitude due to the movement of the frame 8. Thus, vector 410 represents the direction and magnitude of the force exchanged between the frame 8 and the frame 5, 15. The force 410 arises, e.g., due to the axis offset of the axis of the frame 8 relative to the frame 5, 15, the direction and magnitude of the axis offset shown by vector 420. Additionally or alternatively, the force 410 arises, e.g., due to the center-of-gravity offset of the frame 8 relative to the center (e.g., the imaging or optical center) of the frame 8, the direction and magnitude of the center-of-gravity offset shown by vector 430. Other potential causes of the imbalance can include the environment of the frame 8 affecting the frame 8, e.g., gas (if any), and optionally a gas flow, in the environment, a magnetic, electrostatic and/or electric force in the environment (e.g., from another frame 8, from an actuator to move the frame 8, etc.), a bearing associated with the frame 8 (e.g., a magnetic and/or gas bearing), etc.

Not only may such imbalance be deleterious to the particular imbalanced frame 8, the imbalanced frame 8 may have a deleterious effect on the supporting frame 5, 15, on another frame 8, and/or on one or more other components in the apparatus 1. Indeed, even if the imbalance is not significant enough to impair the proper operation of the frame 8 itself, the frame 8's imbalance on its own, or in combination with the imbalance of one or more other frames 8, may be sufficient to cause deleterious effects on the supporting frame 5, 15, on another frame 8, and/or on one or more other components in the apparatus 1. For example, the combined effect of a plurality of slightly imbalanced frames 8 on a common frame 5, 15 may be sufficient to cause deleterious effects on the supporting frame 5, 15, on one or more of the frames 8, and/or on one or more other components in the apparatus 1, when the individual imbalances themselves may not have caused a deleterious effect.

Accordingly, it is desirable to remedy frame 8 imbalance to within tight imaging specifications and/or reduce or eliminate dynamical vibration interaction between frames 8, between frame 8 and supporting frame 5, 15, and/or between any number of other components as a result of frame 8 imbalance.

In an embodiment, where the apparatus comprises a plurality of movable frames 8, the position (e.g., rotation) of one or more of the frames 8 can be tuned to reduce or cancel a total imbalance effect on, for example, support frame 5, 15 due to the frames 8. For example, with a plurality of frames 8 on the same frame 5, 15, an angular position (rotation angle) of one or more of the frames 8 relative to the one or more other frames 8 can be chosen such that a total force on the frame due to imbalance of one or more of the frames 8 is reduced or minimized.

Figure 29:
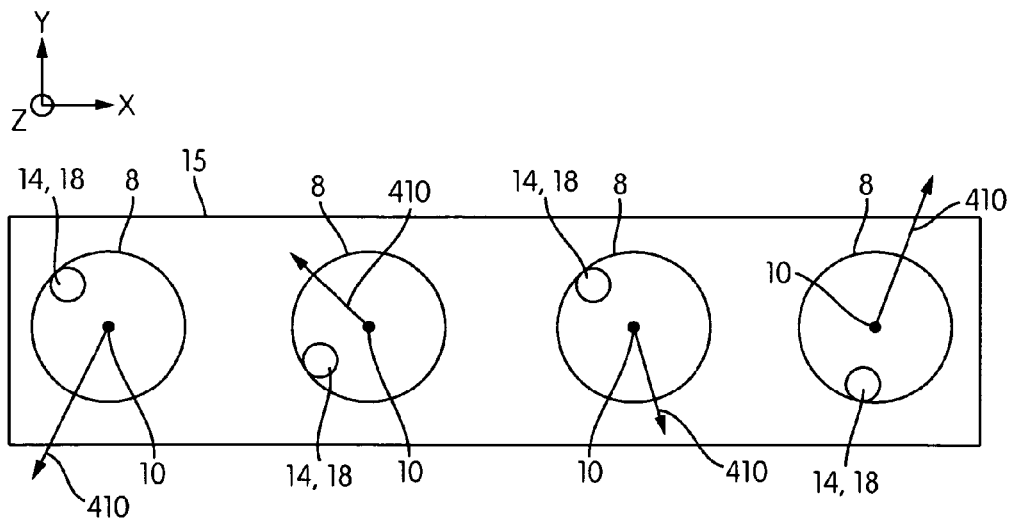
FIG. 29 depicts a schematic top view of a part of a plurality of movable frames and a substantially stationary frame in a lithographic or exposure apparatus.

Referring to FIG. 29, a frame 5, 15 may support a plurality of movable frames 8. In this embodiment, each frame 8 generally rotates about an axis 10 of the respective frame 8. Each frame 8 includes a plurality of lenses 14, 18 (only 1 lens 14, 18 is shown in one frame 8 for clarity although it should be appreciated there may be a plurality of lenses 14, 18 for each frame 8 as shown, for example, in FIGS. 3 and 6). As discussed above, each frame 8 has an imbalance of some amount (even if very small) resulting in application of a net force to the frame 5, 15 by the frame 8. The net force applied by each frame 8 is symbolically depicted by the respective vectors 410 associated with the frames 8. The vectors are merely exemplary of the net direction and magnitude of the forces; the vectors may be of different directions and/or magnitudes and the actual forces may be time-varying in direction and magnitude due to the movement of the frame 8.

Desirably, the sum of all the net forces of the frames 8 caused by their respective imbalances (if any) would yield a zero net force on the frame 5, 15. With substantially no net force on the frame 5, 15, there should be no or little deleterious effect on the supporting frame 5, 15 to due the imbalance, there should be no or little deleterious effect on another frame 8 since the frame 5, 15, via which the imbalance force would be transmitted, has substantially no net force due to the imbalance, and there should be no or little deleterious effect on one or more other components in the apparatus 1 since the frame 5, 15, via which the imbalance force would be transmitted, has substantially no net force due to the imbalance.

To facilitate achieving little or no net force on the frame 5, 15, the magnitude and direction of the imbalance of each of the frames 8 is measured separately. The imbalance of the frame 8 may be measured in various ways and at various times. For example, the imbalance may be measured during use of the frame 8 (e.g., to reduce downtime of the apparatus) and/or may be measured when a frame 8 is not being used (e.g., during a (re-)calibration or maintenance procedure). Further, the frame 8 may be measured in place on the frame 5, 15 and/or measured when removed from the frame 8 (e.g., removed from the frame 5, 15 and measured in a separate imbalance measurement tool).

Figure 30:
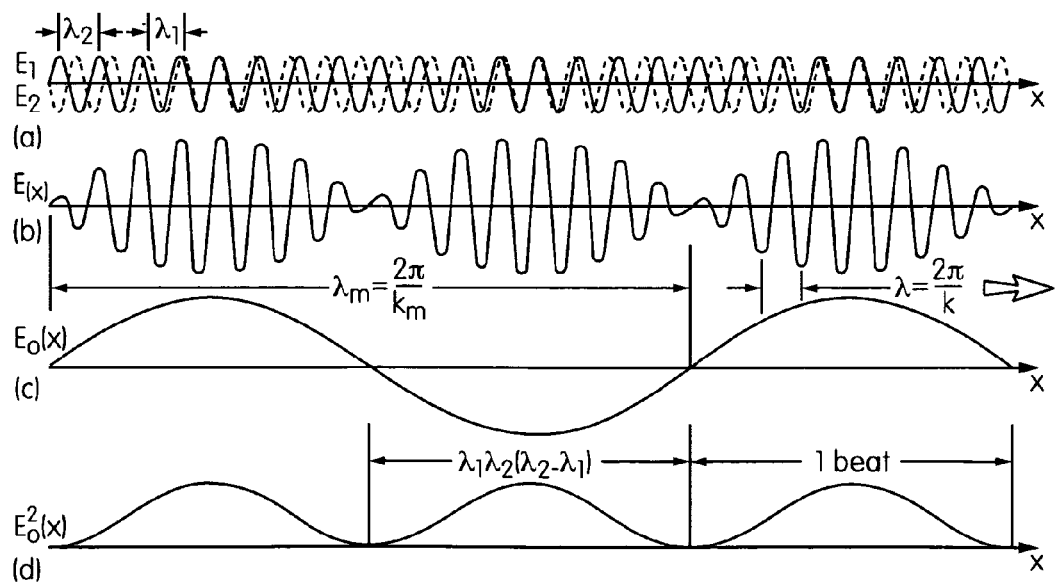
FIGS. 30(A)-(D) are graphs depicting how imbalance of a frame can be measured.

A non-limiting example of how the imbalance can be measured is to obtain a measurement signal (e.g., a signal from a force sensor or accelerometer attached to, e.g., frame 5, 15) of one of the frames when it is disturbed in a horizontal direction (e.g., in the X- and/or Y-direction) at a frequency different than its rotating frequency (e.g. 78 Hz or 80 Hz) and compare that with a measurement signal at its rotating frequency, such that a beat frequency is produced which indicates the 'position' of the unbalance in angular units (e.g. degrees). FIG. 30(A) shows the two measurement signals (E1 and E2) having different frequencies—one at the normal rotation frequency and the other at the different frequency—shown here as a function of their angular position with respect to time. FIG. 30(B) shows the superposition of those two signals E1 and E2. FIG. 30(C) shows the sine, which can be discriminated when analyzing FIG. 30(B). FIG. 30(D) shows the beat frequency as a function of the two other frequencies (note that the minimum amplitude does not need to return to zero in FIG. 30(D), but may have an offset, since the input frequencies will probably have different amplitudes). This beat frequency is a measure for the unbalance, which changes amplitude in time, however at a frequency much smaller than the rotational, or disturbing, frequency. This amplitude variation is a function of phase difference between the two input frequencies, hence the tangential position of the unbalance can be determined. With the position of the unbalance known, one can use the same frequency for both signals to determine the amplitude of the unbalance. For example, the unbalance of the frame can be counteracted at frequency with a correction (e.g., application of a single or plurality of known forces) and if the measurement yields no or little imbalance, the amplitude can be determined. As a result both angular position and magnitude of the unbalance can be determined. In an embodiment, the measurements and calculations may be performed for a range of frequencies to improve the accuracy (and to exclude frequencies of, e.g., one or more other frames).

In another non-limiting example, the imbalance of a frame 8 can be measured indirectly by measuring the position, vibration of and/or force applied to the frame 5, 15. In another non-limiting example, radiation projected through the lenses 14, 18 of a frame may be measured by a radiation sensor (e.g., an intensity sensor) to determine variation of the radiation which correlates to the imbalance. In other words, the sensor may measure the spots projected by a frame 8 to determine the imbalance. Such a sensor could be, for example, a transmission image sensor. The sensor could be located, for example, on the table 2. In an embodiment, a beam splitter may be in, or inserted into, the path of the beam in order to allow the beam to be sampled for measurement by a sensor. In another non-limiting example, servo position error of the frame 8, e.g., of the frame 8 with respect to the frame 5, 15, may be used. As an example, a measurement beam may be used to measure the position of the frame 8 relative to, e.g., frame 5, 15 and/or a frame on which the detector is mounted. Appropriate intermediate measurements may be made to put the measurements of frame 8 into the appropriate coordinate system, e.g., a measurement between a frame holding the sensor and the frame 5, 15, etc.

As will be apparent, the imbalance of a frame 8 can be measured in various different ways using various different systems and/or tools. Moreover, it may not be necessary to obtain values for the angular position and the magnitude of the imbalance. For example, it may be sufficient just to have an indication of the direction of the imbalance if, for example, the magnitude of the imbalance of each frame 8 is substantially, or closely enough, the same.

With imbalance known for the one or more frames 8, steps can be taken to correct for the imbalance. Various different methods can be taken individually or in combination to correct for the imbalance. Some of the methods are discussed below and can be used individually or in combination. Further, for example, the imbalance may be corrected at various times. For example, the imbalance may be corrected during use of the frames 8 (e.g., as the frames are being used to project radiation, during a time between exposure of different target portions, during a time between exposure of different substrates, etc.) and/or may be corrected when the frames 8 are not being used (e.g., during a (re-)calibration or maintenance procedure). Further, an imbalance may be corrected for a particular frame 8 or may be corrected in aggregate for a plurality of frames 8. In the latter case, the correction for a particular frame 8 of the plurality of frames 8 may different than if an imbalance of the frame 8 were corrected just to reduce or eliminate the imbalance for the frame 8. For example, an imbalance of a frame 8 may not be reduced in of itself but rather re-oriented such that it can cancel out an imbalance of another frame 8.

In an embodiment, the imbalance may be corrected by adjusting the position of one or more frames 8 relative to one or more of the other frames 8. In particular, such correction should take account the position of the one or more other frames 8. In an embodiment, the adjustment of the one or more frames 8 should be such that the forces that each frame 8 puts on the frame 5, 15 cancels as much as possible the forces being put on the frame 5, 15 by the other one or more frames 8.

Figure 31:
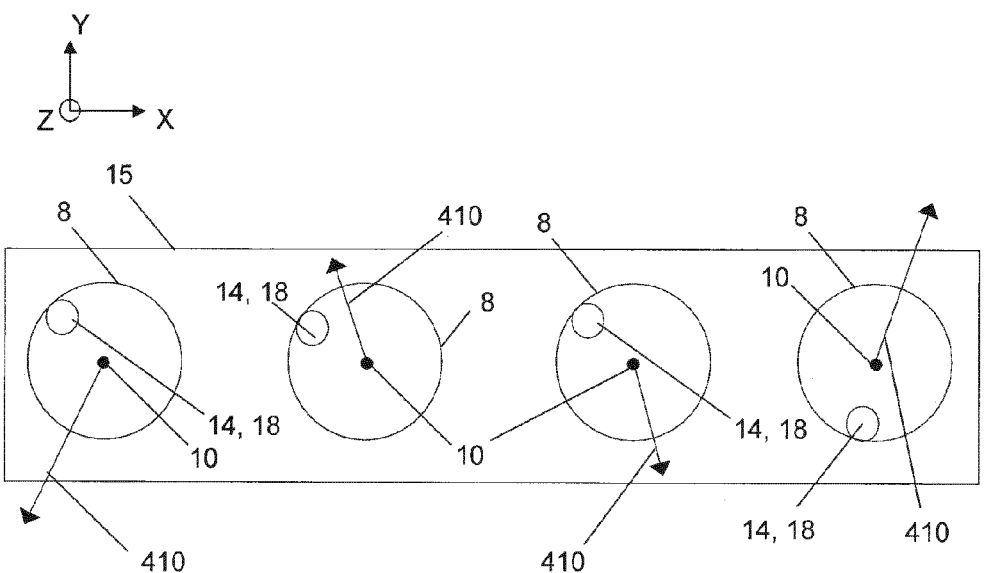
FIG. 31 depicts the part of a plurality of movable frames and a substantially stationary frame in a lithographic or exposure apparatus of FIG. 29 with an angular position of one of the movable frames changed.

In an embodiment, the adjustment of the position comprises adjusting the angular position of one or more frames 8 relative to the angular position of one or more other frames 8. More specifically, the angular position of a particular portion of a frame 8 at a certain time in its rotation is adjusted relative to the angular position of a particular portion of another frame 8 at that same time. For example, referring to FIG. 31, the frame 5, 15 supporting the plurality of movable frames 8 of FIG. 29 is shown. As discussed above, the frames 8 rotate about their respective axis 10. FIGS. 29 and 31 show, for example, the frames 8 during their respective rotations at a particular point in time. To show how the imbalance may be corrected, the second frame 8 from the left in FIG. 31 has its angular position adjusted relative to the other frames as can be seen when compared with FIG. 29. In particular, the depicted lens 14, 18 (e.g., lens 1 of X number of lenses) on the frame 8 in FIG. 29 has its angular position adjusted from about the 8 o'clock position in FIG. 29 to about the 10 o'clock position. In other words, the phase angle of the frame 8 is adjusted even though it rotates at the same frequency. Through this adjustment, as shown in FIG. 31, the direction of the imbalance is changed (and optionally the magnitude may be changed depending on the nature of the imbalance of that frame 8). When this change in imbalance of one frame 8 is factored in with the imbalance of one or more of the other frames 8, the forces that the frames 8 put on the frame 5, 15 should be effectively cancelled out. This may require altering the position of one or more of the other frames 8 so that the overall force applied to the frame 5, 15 is close to zero (or below a tolerable level).

In an embodiment, where the frame 8 has one or more lenses 14, 18, the location of a lens 14, 18 relative the radiation beam from controllable element 4 is significant. In particular, the lens 14, 18 may need to be in a particular position with respect to that beam so that it can appropriately receive the beam. Further, a lens 14, 18 of another frame 8 receiving a radiation beam may also need to be in a particular position when receiving its beam and also in a particular position with respect to the lens 14, 18 of another frame. For example, as shown in FIG. 2, the lenses 14, 18 of different frames 18 may need to be in aligned in a particular orientation to expose a target portion. Accordingly, in an embodiment, the change in position of the frame 8 to compensate at least in part for imbalance may take into account the position of the one or more lenses 14, 18 on the frame 8. In an embodiment, a frame has a plurality of lenses 14, 18 around the center axis 10 (see, e.g., FIGS. 3 and 6 although FIGS. 29 and 31 show just one lens 14, 18 for clarity purposes). Thus, in an embodiment, the number of angular position adjustments available for a frame 8 includes at least the number of lens 14, 18 around the axis 10. For example, if 200 lenses 14 or 18 are arranged around the axis 10 of a particular frame 8, then 200 angular positions of the frame 8 are possible without having to adjust illumination timing. Thus, a large number of lenses on the frame 8 allows for a significant adjustment freedom, and thus for a significant reduction of excitation force. For example, a six degrees of freedom imbalance effect in all directions can be taken into account, given ten movable frames 8 with ten imbalance vectors.

Additionally or alternatively to adjustment using a particular angular location of the lens 14, 18, the illumination adjustment may be used to help effect position adjustment, e.g., to an angle in between two adjacent lenses 14, 18 around the axis 10. For example, the frame 8 can be adjusted to a particular position and if the lens 14, 18 is not appropriately aligned with respect to a beam, e.g., in the case where the beams all are synchronously provided to each of the frames 8 from the controllable elements 4, the timing of the projection of radiation onto a lens 14, 18 of a frame 8 may be adjusted vis a vis the projection of radiation onto a lens 14, 18 of another frame, e.g., the beams become asynchronous or differently asynchronous. If needed, appropriate shifting of the projection of a portion of the pattern may need to be shifted or shared between frames 8 through the apparatus controller adjusting the allocation of the pattern production among the frames 8.

An additional or alternative way the imbalance for one frame 8 or for a plurality of frames 8 may be corrected is to adjust the imbalance of a particular frame 8 itself. For example, the frame 8 may have weight added or removed to change the direction and/or magnitude of the imbalance.

An additional or alternative way the imbalance may be corrected for one frame 8 or for a plurality of frames 8 is to adjust the frame 5, 15 supporting the one or more frames 8. For example, an actuator may be used to apply a counterbalancing force to the frame 8 to compensate at least in part for the force applied to the frame 5, by the one or more frames 8. In an embodiment, the net imbalance imparted by all the frames 8 supported on the frame 5, 15 may be determined (by calculation and/or by measurement) and a counterbalancing force may be applied to the frame 5, 15 by the actuator. Such application of force may be complex due the movement of the frames 8 and the actuator will need to operate at the substantially same frequency as the frames 8.

An additional or alternative way the imbalance may be corrected for one frame 8 or for a plurality of frames 8 is to employ a balance or reaction mass for the one or more frames 8 or a balance or reaction mass for the frame 5, 15 supporting the one or more frames 8. See, e.g., U.S. Pat. Nos. 6,525,803 and 6,449,030, each incorporated herein in their entirety by reference, for the design principles and exemplary structures of a balance or reaction mass, which would then be appropriately configured for a particular frame 8, a plurality of frames 8 and/or the frame 5, 15. The balance or reaction mass may be configured to cancel out in part or as a whole forces in a particular one direction, in two directions (e.g., X-Y plane), in three directions, in four directions (e.g., X-Y-Z and rotation about 1 of the three directions), in five directions or in six directions.

Figure 32:
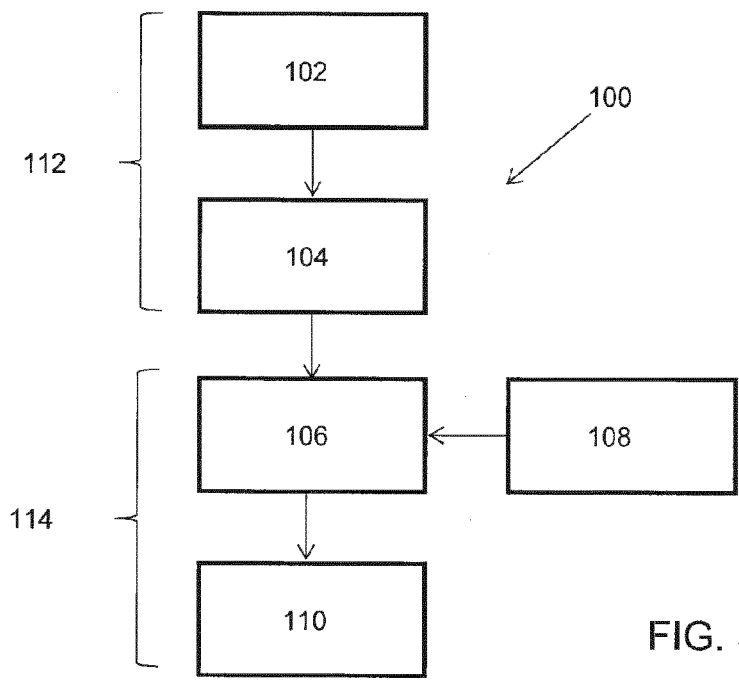
FIG. 32 depicts a portion of a data-path for converting a vector-based representation of a desired device pattern to a control signal.

An additional or alternative way the imbalance may be corrected for one frame 8 or for a plurality of frames 8 is to employ a correction of the data used to control one or more controllable elements 4 (and/or one or more other modulating devices) to compensate at least in part for the imbalance of the one or more frames 8. In particular, for example, hardware and/or software constituting a "data-path" may be provided to convert a vector-based representation of a desired device pattern to be formed on a substrate to a control signal suitable for driving a programmable patterning device. FIG. 32 is a schematic illustration showing example processing stages 100 that may be included in such a data-path. In an embodiment each of the stages is connected directly to its neighboring stages. However, this need not be the case. In an embodiment one or more additional processing stages may be provided in between any of the stages shown. Additionally or alternative, each of one or more of the stages may comprise multiple stages. One or more of the stages may be combined.

In the example shown in FIG. 32 a vector-based representation of a desired device pattern is provided in stage 102. The vector-based representation may be constructed using a vector design package such as GDSII. The stored vector-based representation is forwarded to a rasterization stage 104, either directly or via one or more intermediate stages. Examples of intermediate stages include a vector pre-processing stage and a low-pass filter stage. The low-pass filter stage may perform anti-aliasing processing for example.

The rasterization stage 104 converts the vector-based representation (or a processed version of the vector-based representation) of the desired device pattern to a rasterized representation of a desired dose pattern that corresponds to the desired device pattern (i.e. is suitable for forming the desired device pattern by post-exposure processing of the substrate). The rasterized representation may comprise bitmap data, for example. The bitmap data may be referred to as "pixelmap" data. The bitmap data may comprise a set of values indicating the desired dose at each point on a grid of points. The grid of points may be referred to as a rasterization grid.

The rasterized representation (as output from the rasterization stage 104 directly or after further processing) may be supplied to a control signal generation stage 106. The control signal generation stage 106 may be implemented as a single stage (as shown) or as a plurality of separate stages.

The control signal generation stage 106 may perform a mapping operation between the rasterization grid and the grid (which may be referred to as the "spot exposure grid") defining the locations at which the patterning device can form spot exposures at the target (e.g., substrate) level. The mapping operation may comprise interpolation between the rasterization grid and the spot exposure grid. The mapping operation may be configured to receive metrology data from a metrology data storage stage 108. The metrology data may specify, for example, the position and/or orientation of the mounted substrate, and/or a previously formed device pattern on the mounted substrate, relative to the patterning device. The metrology data may also specify measured distortions of a mounted substrate or previously formed device pattern. The distortions may include shift, rotation, skew and/or magnification, for example. The metrology data therefore provides information about how the interpolation between the rasterization grid and the spot exposure grid should be carried out in order to ensure proper positioning of the desired dose pattern on the target. As discussed in more detail below, the metrology data may also include information about the imbalance of one or more frames 8.

The control signal generation stage 106 may calculate a set of intensities to be applied at each position in the spot exposure grid to form the desired dose pattern. The set of intensities may define, for each position in the grid, the intensity of the radiation beam that is to be used to generate the spot at that position, for example. This calculation may account for the properties of the optical projection system and may therefore be referred to as an "inverse-optics" calculation. The calculation may account for the sizes and/or shapes of individual spots, for example, which may be dictated by properties of the optical projection system. The size and/or shape may be defined for each of a given set of possible applied intensities for the spot. The spot size and/or shape may define the variation with position of the applied dose for a given spot for example. The calculation may also take into account deviations in the positions of the spots from nominal positions defined by the ideal (i.e. engineering error free) spot exposure grid geometry.

The spots may overlap with each other at target level so that the final dose achieved at a reference position in the spot exposure grid may depend on the applied intensities at a number of neighboring spots. This effect may be modeled mathematically by a convolution operation. The control signal generation stage 106 needs to perform the reverse process (determine the intensities that need to be applied at each position for a given desired dose pattern), so a deconvolution operation may be performed. The deconvolution operation may be defined by a deconvolution kernel. The deconvolution kernel may be represented by a deconvolution matrix. The coefficients of such a deconvolution matrix may be interpreted as weights that define the extent to which the dose at points in the region of a reference point in the desired dose pattern need to be taken into account when calculating the intensity to be applied at the corresponding point (or spot) in the spot exposure grid.

Figure 33:
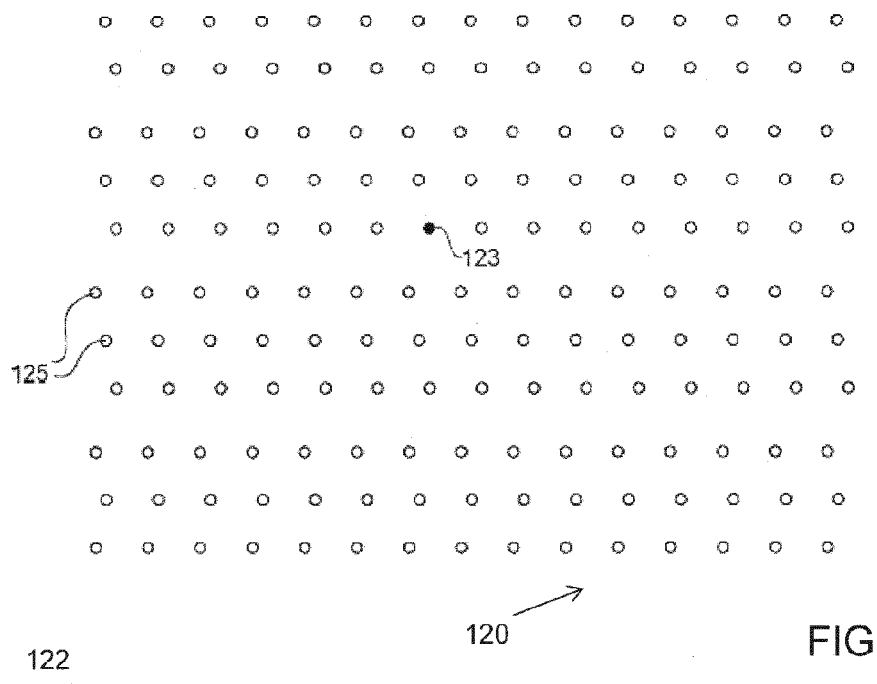
FIG. 33 depicts a portion of a spot exposure grid.
Figure 34:
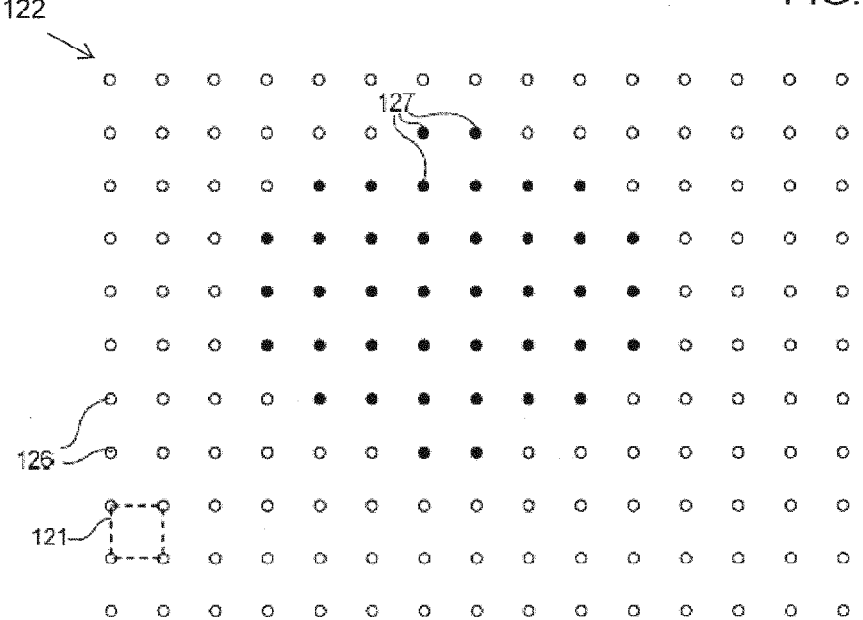
FIG. 34 depicts a portion of a rasterization grid.

FIGS. 33 and 34 illustrate schematically a step in such a deconvolution operation.

FIG. 33 illustrates a portion of an example spot exposure grid 120. Each point 125 in the grid 120 represents the center of a spot that will be formed by the patterning device on the target. The deconvolution operation aims to determine the intensity value to apply at each of the points 125. The spot exposure grid 120 will have a geometry that corresponds to the pattern of spot exposures that the patterning device is able to form on the target. The geometry of the spot exposure grid may therefore be irregular. In an irregular grid, within the meaning of the present application, the density of grid points varies as a function of position so that it is not possible to construct the grid completely by tessellating a single unit cell that contains a single grid point only. The geometry of the grid 120 that is illustrated in FIG. 33 is greatly simplified and does not necessarily resemble a spot exposure grid associated with a commercial device.

FIG. 34 illustrates an example portion of a rasterization grid 122. In this example the rasterization grid 122 has a regular geometry. In this example the regular geometry is rectangular. The density of grid points of a regular grid, within the meaning of the present application, is "uniform" in the sense that the grid can be completely formed by tessellating a single type of unit cell that comprises a single grid point only. Dotted line 121 illustrates an example unit cell. The dotted line intersects a quarter of four grid points and therefore contains one grid point in total. A sample of the desired dose pattern may be provided at each of the points 126 in the grid 122.

The solid grid point 123 in FIG. 33 represents a reference grid point (chosen at random). Application of the deconvolution operation for deriving the intensity to be applied at the solid grid point 123 will involve weighted contributions of the samples of the desired dose pattern at a plurality of grid points in the spot exposure grid in the region of the spot exposure grid corresponding to the position of the reference grid point 123. The solid grid points 127 in FIG. 34 represent schematically the grid points that may be involved with such a deconvolution operation. In an embodiment, a deconvolution kernel expressed as a matrix will define which grid points 126 are involved (by the positions of the non-zero coefficients in the matrix) and the extent to which the grid points are involved (by the values of the non-zero coefficients in the matrix).

The nature of the deconvolution operation may be different for different points in the spot exposure grid and/or between points. This variation may take into account variations in the optical performance of the patterning device for example. The variations in optical performance may be obtained using calibration measurements. In an embodiment a library of deconvolution kernels, optionally obtained from calibration measurements, may be stored and accessed as needed.

The control signal generation stage 106 may convert the sequence of intensity values to be applied at each of the points in the spot exposure grid to setpoint values in order to generate the control signal. The setpoint values may take into account the nature of the patterning device. For example, where the patterning device comprises a plurality of self-emissive contrast devices, the setpoint values may account for non-linearity in the response of the self-emissive contrast devices. The setpoint values may take into account variations in the properties of nominally identical contrast devices by calibration measurements for example.

A control signal output stage 110 receives the control signal from the control signal generation stage and supplies the signal to the patterning device.

In the example shown, stages 102 and 104 are performed in an offline part 112 of the data-path and stages 106-110 are performed in an online part 114 of the data-path. In an embodiment all or a portion of the functionality associated with stage 104 could be carried out online. Alternatively or additionally, all or a portion of the functionality of stages 106 and/or 108 could be carried out offline.

In an embodiment, to correct for imbalance in the X-Y plane of the frame 8, e.g., a displacement or vibrations in a direction in the X-Y plane, the data may be mathematically manipulated using, for example, control signal generation stage 106 to cause a compensating shift of at least part of the pattern in the X-Y plane. Since the imbalance of the frame 8 can cause a displacement or vibration of the lens 14, 18, the lens 14, 18 in turn can cause at least part of the pattern to be displaced in the X-Y plane from where it is expected that the at least part of the pattern would be incident on the target portion.

Accordingly, for a displacement or vibrations in a direction in the X-Y plane, the data of the at least part of the pattern may be, for example, interpolated or extrapolated with associated data adjacent to the at least part of the pattern, to produce data that causes modulated radiation that would otherwise to be supplied to the frame to be altered to account for the imbalance. For example, if the displacement or vibration is in the X direction, an adjacent part of the pattern in the X direction would be sampled and then interpolated/extrapolated data is calculated, the interpolated/extrapolated data causing different modulated radiation to be produced compared to without the compensation. In effect, the result is a slight shift in at least part of the pixel map of the pattern (e.g., half a pixel) to compensate at least in part for the slight shift caused by the frame 8 imbalance. In effect, for example, at least part of the radiation associated with the affected at least part of the pattern to be projected may be supplied earlier or later than according to nominal set point data with the subsequent effect of the imbalance of the frame 8 the shift of the at least part of the pattern is at least in part compensated. Relatedly, the correction of the data, and the resulting modulated radiation, may result in shift of at least part of the pattern that would be projected by a first frame 8 to a second frame 8 to account for the imbalance attributable to the first frame 8. In sum, the radiation spot coordinate system for the frame 8 is moving with respect to the substrate coordinate system associated with the frame 8 due the imbalance in the frame 8 and that relative motion may be compensated at least in part for by making the appropriate change in the data.

Further, the imbalance may be in or have a component in the Z direction. FIG. 33 above illustrates the spot exposure grid 120 at a single plane, e.g. a nominal plane of best focus, where each grid point represents a nominal location of a beam on the target. However, in that plane, the positions of the grid points may vary from an ideal uniform grid for a variety of reasons. One such reason may be the imbalance of the frame 8 which can cause the radiation not to be focused at the nominal plane of best focus and thus a spot shape can vary from an expected spot shape based on set point data. So, it may be necessary to take into account position in the Z direction, that is perpendicular to the nominal plane of best focus and parallel to the optical axis of the projection system. For example, even when the target (e.g., substrate) is positioned optimally relative to the plane of best focus at the locations where some of the beams are incident on the target, the beams may nevertheless not lie exactly in the plane of best focus.

Therefore, in an embodiment, to correct for frame 8 imbalance in the Z direction, account is taken of the frame 8 imbalance in the Z direction in calculating beam intensities for projecting a plurality of spots on a target. In effect, the imbalance in the Z-direction causes a defocus, which may be corrected by deconvolution to change the intensity values and/or distribution compared to nominal set point data (where the beam is projected at a nominal best focus plane).

In an embodiment of the invention, control signal generation stage 106 may store a plurality of deconvolution kernels for each grid point 126 (which may be structured as a look-up table with the calculated Z position discussed below being used to select the appropriate deconvolution kernel). The plurality of deconvolution kernels are each associated with a Z position. In an embodiment, the plurality of deconvolution kernels are associated with Z positions that span and sample a range of about 10 μm, e.g., −5 μm from nominal best focus to +5 μm from nominal best focus by 1 μm increments. When performing the deconvolution operation to determine the intensity value to apply at each of the points 125, the control signal generation stage 106 consults the data regarding the imbalance in the Z direction and determines the expected Z position of the location on the substrate corresponding to the grid point 125 at the expected time of the exposure. The calculated or predicted Z position is then used to select an appropriate one of the deconvolution kernels.

In an embodiment, in the event that the calculated Z position does not correspond exactly to the Z position of one of the stored deconvolution kernels, a deconvolution kernel is calculated from the stored deconvolution kernels by interpolation or extrapolation. Having selected or calculated a suitable deconvolution kernel for each grid point 125, the deconvolution calculation proceeds as above.

In an embodiment, a 3-dimensional deconvolution calculation is carried out for the volume defined by the area to be exposed at one time and the Z-position range covered by the deconvolution kernels. The 3-dimensional calculation is effectively a 2-dimensional calculation at each of a plurality of steps in the Z direction. Having carried out the 3-dimensional calculation, the spot intensities are obtained by selecting from the plurality of calculated values the appropriate ones for the expected Z positions at each grid position (or appropriately interpolating or extrapolating).

In an embodiment, the calculation of beam intensities is performed in advance of the exposure. In an embodiment of the invention, the deconvolution calculation is carried out "on-the-fly", that is while the exposures are being performed. In this embodiment, data from a measurement device is used to provide a real-time measurement of the imbalance. This is then used to select or determine the appropriate deconvolution kernel based on the library of deconvolution kernels (and, if required, an appropriate interpolation/extrapolation is performed).

In embodiment, deconvolution kernels for the different Z positions are obtained by a calibration procedure. For example, an image of the beam may be taken at different Z positions, e.g. the nominal plane of best focus and five steps above and below it, using an imaging device such as a CCD. The deconvolution kernels can be calculated from such images. The number of calculated deconvolution kernels can be greater than the number of measurements taken.

In an embodiment, instead of interpolation or extrapolation, another fitting technique may be used, such as least squares or other minimization technique.

In an embodiment, in addition to or alternatively to deconvolution kernels for Z position, one or more deconvolution kernels may be provided for $R_x$ and/or $R_y$ imbalance.

In an embodiment, for $R_x$ and/or $R_y$ imbalance, a combination of the X/Y imbalance compensation technique and the Z imbalance compensation technique may be used. For example, $R_x$ and/or $R_y$ imbalance can be taken into account, e.g. in the calculation of a kernel based on the stored kernels.

Further, intensity of the one or more radiation beams may be adjusted so that the intensity of the exposed spot has a lower intensity away from a central portion (peak) of the exposed spot in a particular direction or in various directions than nominal set point data to facilitate overlapping of spots. By having a lower value, the double exposure of an area by a beam spot subject to an imbalance and by an adjacent spot can be at least in part remedied.

With the correction for imbalance discussed herein, improved performance may be achieved. For example, there may be less excitation of the frame 5, 15, meaning potentially less dynamic response and better imaging. Additionally or alternatively, there may be less dynamic vibration interaction in between frames 8. Further, the ability to correct for frame 8 imbalance may allow reduced frame 8 balance requirements, i.e. initial balancing. The corrections herein also may make it easier to replace a frame 8 (e.g., in the field) because the imbalance of the frame 8 can be addressed automatically in the tool and high balancing requirements of each frame 8 or the combination of frames 8 can be reduced (e.g., extensive tuning and configuration of a frame 8 or of a plurality of frames 8 may not be required).

In an embodiment, references to compensation or compensating herein includes a specific or net reduction by more than or equal to 1%, more than or equal to 2%, more than or equal to 5%, more than or equal to 10%, more than or equal to 20%, more than or equal to 30%, more than or equal to 40%, more than or equal to 50%, more than or equal to 60%, more than or equal to 70%, more than or equal to 80%, more than or equal to 90%, or about 100%.

In accordance with a device manufacturing method, a device, such as a display, integrated circuit or any other item may be manufactured from the substrate on which the pattern has been projected.

Although specific reference may be made in this text to the use of a lithographic or exposure apparatus in the manufacture of ICs, it should be understood that the lithographic or exposure apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. An exposure apparatus, comprising:
   a projection system configured to project a plurality of radiation beams onto a target;
   a movable frame that is at least rotatable around an axis;
   an actuator system to cause the movable frame to rotate; and
   a controller to adjust a position of the movable frame and a modulation or intensity characteristic of at least one of the radiation beams, to compensate at least in part for imbalance of or applied to the movable frame or imbalance of or applied to another movable frame.

2. The apparatus of claim 1, comprising a plurality of movable frames that are each at least rotatable around an axis and supported by a common frame, wherein the other movable frame is one of the plurality of movable frames.

3. The apparatus of claim 2, wherein the controller is configured to adjust the position of the movable frame such that a force that the movable frame puts on the common frame in combination with forces put on the common frame by the other movable frames leads to an effective cancellation of the forces.

4. The apparatus of claim 1, wherein the adjustment of the position of the movable frame comprises a change in phase angle of the movable frame.

5. The apparatus of claim 4, wherein the change in phase angle comprises a change in phase angle from the angular position of a lens of a plurality of lenses of the movable frame to the angular position of another lens of the plurality of lenses of the movable frame.

6. The apparatus of claim 1, further comprising a measurement system configured to measure the imbalance of at least one movable frame.

7. The apparatus of claim 6, wherein the measurement system is configured to obtain a first measurement signal of the at least one movable frame, when disturbed, at a frequency different than its rotating frequency and compare the first measurement signal with a second measurement signal of the at least one movable frame at its rotating frequency to obtain the position of the imbalance.

8. The apparatus of claim 7, wherein the measurement system is configured to determine the amplitude of the imbalance using the position of the imbalance and the same frequency for both the first and second measurement signals.

9. The apparatus of claim 7, wherein the measurement system is configured to obtain the first measurement signal at a plurality of different frequencies.

10. The apparatus of claim 6, wherein the measurement system is configured to determine the imbalance by measuring the position, vibration of and/or force applied to a frame supporting the at least one movable frame.

11. The apparatus of claim 6, wherein the measurement system is configured to determine the imbalance by measuring radiation projected through a lens of the at least one frame using a radiation sensor.

12. A device manufacturing method comprising:
   projecting a plurality of radiation beams onto a target;
   rotating a movable frame around an axis using an actuator system; and
   adjusting a position of the frame to compensate at least in part for imbalance of or applied to the frame or imbalance of or applied to another movable frame, the adjusting the position of the movable frame comprising changing a phase angle of the movable frame.

13. The method of claim 12, wherein there are a plurality of movable frames that are each at least rotatable around an axis and supported by a common frame, wherein the other movable frame is one of the plurality of movable frames.

14. An exposure apparatus, comprising:
   a projection system configured to project a plurality of radiation beams onto a target;
   a plurality of movable frames that are each at least rotatable around a respective axis and supported by a common frame;
   an actuator system to cause at least one of the movable frames to rotate; and
   a controller to adjust a position of the at least one movable frame to compensate at least in part for imbalance of or applied to the at least one movable frame or imbalance of or applied to another frame of the movable frames, such that a force that the at least one movable frame puts on the common frame in combination with force put on the common frame by the other movable frame leads to an effective cancellation of the forces.

15. The apparatus of claim 14, wherein the adjustment of the position of the at least one movable frame comprises a change in phase angle of the at least one movable frame.

16. The apparatus of claim 14, further comprising a measurement system configured to measure the imbalance of at least one movable frame.

17. An exposure apparatus, comprising:
   a projection system configured to project a plurality of radiation beams onto a target;
   a movable frame that is at least rotatable around an axis;

an actuator system to cause the movable frame to rotate; and a controller to adjust a position of the movable frame to compensate at least in part for imbalance of or applied to the movable frame or imbalance of or applied to another movable frame, the adjustment of the position of the movable frame comprising a change in phase angle of the movable frame.

18. The apparatus of claim 17, wherein the change in phase angle comprises a change in phase angle from the angular position of a lens of a plurality of lenses of the movable frame to the angular position of another lens of the plurality of lenses of the movable frame.

19. The apparatus of claim 17, further comprising a measurement system configured to measure the imbalance of at least one movable frame.

20. The method of claim 12, further comprising measuring the imbalance of at least one movable frame using a measurement system and the adjusting the position of the movable frame is based on the measurement of the imbalance.

\* \* \* \* \*